US008169595B2

(12) United States Patent
Schriever et al.

(10) Patent No.: US 8,169,595 B2
(45) Date of Patent: May 1, 2012

(54) OPTICAL APPARATUS AND METHOD FOR MODIFYING THE IMAGING BEHAVIOR OF SUCH APPARATUS

(75) Inventors: Martin Schriever, Aalen (DE); Ulrich Wegmann, Koenigsbronn (DE); Stefan Hembacher, Bobingen (DE); Bernhard Geuppert, Aalen (DE); Juergen Huber, Heidenheim (DE); Norbert Kerwien, Moegglingen (DE); Michael Totzeck, Schwaebisch Gmuend (DE); Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 573 days.

(21) Appl. No.: 12/357,126

(22) Filed: Jan. 21, 2009

(65) Prior Publication Data
US 2009/0174876 A1 Jul. 9, 2009

Related U.S. Application Data

(63) Continuation of application No. PCT/EP2007/006407, filed on Jul. 19, 2007.

(30) Foreign Application Priority Data

Jul. 24, 2006 (DE) .......................... 10 2006 034 755

(51) Int. Cl.
*G03B 27/72* (2006.01)
*G03B 27/54* (2006.01)

(52) U.S. Cl. ............................................. 355/69; 355/67
(58) Field of Classification Search .................. 355/53, 355/67–71; 359/819–820; 250/492.2, 548
See application file for complete search history.

(56) References Cited

U.S. PATENT DOCUMENTS

| 4,577,932 | A |   | 3/1986 | Gelbart |
| 5,818,507 | A | * | 10/1998 | Genovese ..................... 347/261 |
| 5,825,844 | A |   | 10/1998 | Miyake et al. |
| 6,037,967 | A |   | 3/2000 | Allen et al. |
| 6,072,813 | A |   | 6/2000 | Tournois |
| 6,307,688 | B1 |  | 10/2001 | Merz et al. |
| 6,490,390 | B1 |  | 12/2002 | Wilcox |
| 6,574,035 | B2 |  | 6/2003 | Naiki |
| 6,597,763 | B2 |  | 7/2003 | Holler et al. |
| 6,724,463 | B2 | * | 4/2004 | Taniguchi ....................... 355/53 |
| 6,770,866 | B2 | * | 8/2004 | Retschke et al. ............. 250/235 |
| 2002/0075996 | A1 |  | 6/2002 | Holler et al. |
| 2004/0150806 | A1 |  | 8/2004 | Brunotte et al. |

OTHER PUBLICATIONS

International Preliminary Report on Patentability and Written Opinion for the corresponding PCT Application No. PCT/EP2007/006407, dated Feb. 17, 2009.

* cited by examiner

*Primary Examiner* — Hung Henry Nguyen
(74) *Attorney, Agent, or Firm* — Fish & Richardson P.C.

(57) ABSTRACT

The disclosure relates to an optical apparatus including a light source that emits light in the form of light pulses having a pulse frequency, and including at least one optical element. The disclosure also relates to a projection exposure machine including a pulsed light source and a projection objective, and to a method for modifying the imaging behavior of such an apparatus, such as in a projection exposure machine.

52 Claims, 16 Drawing Sheets

Figure 1:
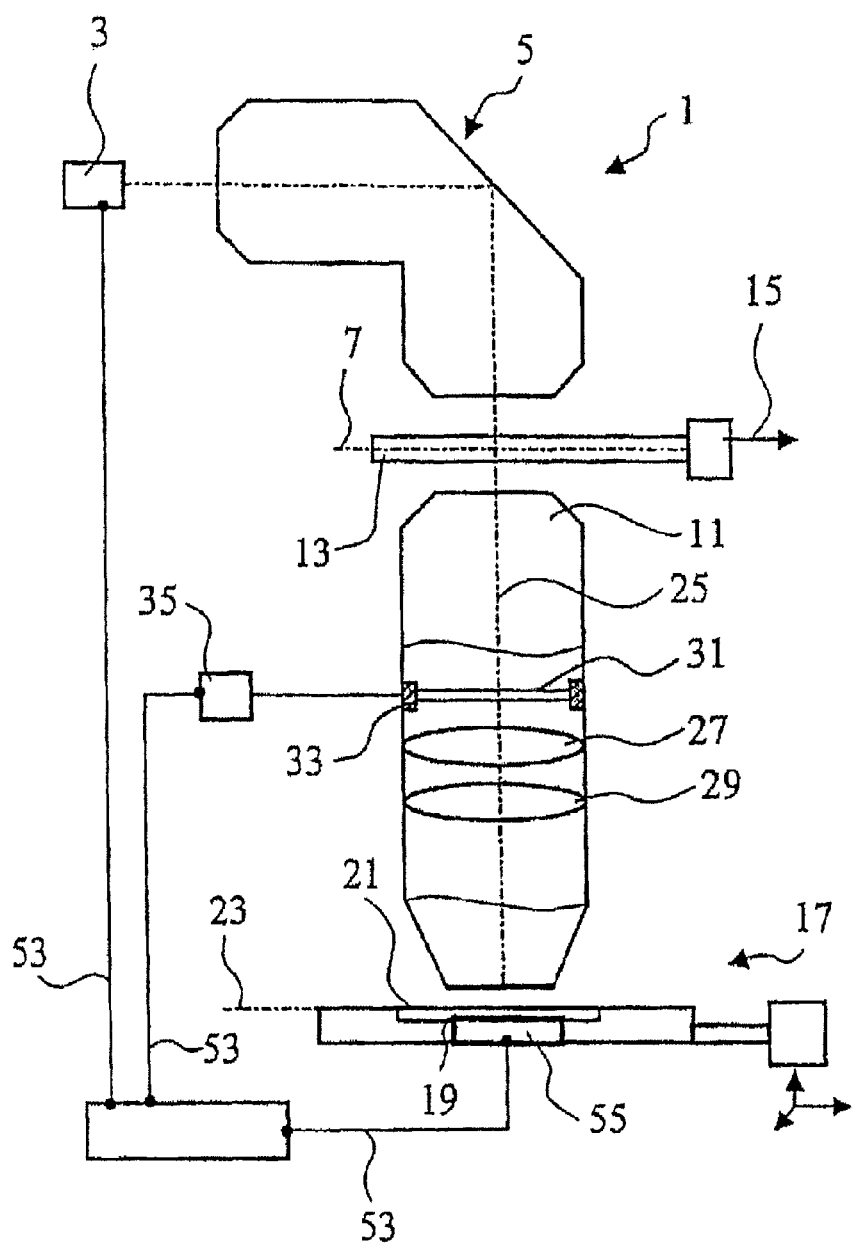

OPTICAL APPARATUS AND METHOD FOR MODIFYING THE IMAGING BEHAVIOR OF SUCH APPARATUS

CROSS-REFERENCE TO RELATED APPLICATIONS

This application is a continuation of, and claims priority under 35 U.S.C. §120 to, international application PCT/EP2007/006407, filed Jul. 19, 2007, which claims benefit of German patent application 10 2006 034 755.2, filed Jul. 24, 2006. International application PCT/EP2007/006407 is hereby incorporated by reference in its entirety.

FIELD

The disclosure relates to an optical apparatus including a light source that emits light in the form of light pulses having a pulse frequency, and including at least one optical element. The disclosure also relates to a projection exposure machine including a pulsed light source and a projection objective, and to a method for modifying the imaging behavior of such an apparatus, such as in a projection exposure machine.

BACKGROUND

Optical apparatuses may change their imaging properties for a wide variety of reasons in the course of their operation. By way of example, material properties may change as a result of aging, and deformations of the optical elements may occur as a result of temperature gradients or as a result of the influence of mechanical forces, for example as a result of the mount. If optical apparatuses are exposed to intensive radiation over a relatively long time, this may likewise lead to alterations of the imaging properties.

On short time scales (seconds), too, for example due to alteration of the quantities of light radiated in (change in the illumination settings or change in the imaging patterns brings about different light paths and intensities in the system), alterations of the imaging properties in the seconds range can be expected.

This relates particularly to projection exposure machines for microlithography. Besides the aging phenomena mentioned, a change in the refractive index may occur, for example, in optical elements made of quartz, as are often used at the present time, under intensive UV radiation loading. Coatings of the optical elements in an objective of a projection exposure machine may also change their properties under irradiation or on account of contamination. All these influences contribute to changing the imaging properties in the course of the objective's operating period. This often gives rise to new image aberrations or amplifies image aberrations that were already present. In objectives for microlithography, therefore, the expected changes in the imaging properties are taken into consideration as early as during the design of the optical system.

SUMMARY

In some embodiments, the disclosure provides an optical apparatus, such as a projection exposure machine, in which image aberrations that arise in the course of the operating period, such as higher-order image aberrations, can be corrected using the simplest possible approach.

In certain embodiments, the disclosure provides an optical apparatus that includes a light source capable of emitting light in the form of light pulses having a pulse frequency. The optical apparatus also includes a clock generator configured to generate the pulse frequency of the light pulses, and an optical element. In addition, the optical apparatus includes apparatuses configured to excite an oscillation of the optical element with an oscillation frequency that can be synchronized with the pulse frequency. The optical apparatus further includes a frequency multiplier, the frequency multiplier being connected to both the clock generator and the apparatuses configured to excite an oscillation. Oscillation of the optical element leads to a temporally periodic modula-tion of at least one parameter of the optical element that is relevant to optical imaging.

In some embodiments, the disclosure provides a projection exposure machine that includes an optical apparatus as set forth in the preceding paragraph.

In some embodiments, the disclosure provides a method that includes providing a projection exposure machine, which includes a pulsed light source having a pulse frequency, and an optical element. The method also includes oscillating the optical element with an oscillation frequency that is synchronized with the pulse frequency of the pulsed light source so that there is a temporally periodic modulation of at least one parameter of the optical element that is relevant to optical imaging of the projection exposure machine. The oscillation frequency of the optical element is set as an integer multiple of the pulse frequency, and the method modifies imaging behaviour of the projection exposure machine.

In some embodiments, an optical apparatus has a light source that emits light in the form of light pulses, and an optical element connected to apparatuses for the excitation of an oscillation of the optical element. The oscillation of the optical element leads to a temporally periodic modulation of at least one parameter of the optical element that is relevant to the optical imaging, such as, for example, refractive index, polarization properties, density, form, position or angle. The oscillation frequency can be set by the apparatuses for the excitation of an oscillation of the optical element such that it is synchronized with the pulse frequency of the light source or a harmonic (integer multiple of the pulse frequency). Provision is made of a clock generator for the pulse frequency of the light pulses. At least one frequency multiplier is connected to the clock generator, and the output of the at least one frequency multiplier is connected to the apparatuses for generating an oscillation. As used herein, an oscillation of the optical element should be understood to mean not only a local spatial deflection of the optical element, but also sound waves, pressure waves, density waves, etc., which propagate within the optical element.

A pulsed light source is to be understood herein to mean any type of light source that emits light in the form of individual, temporally separate light pulses, such as a pulsed laser, for example, but also a stroboscope. The light flux or the light intensity is varied periodically in this case. This periodicity may, as, for example, in the case of pulsed lasers or other electronically switchable or controllable light sources, be set directly, for example by electronic circuitry. However, the periodic light modulation may also be set by one or a plurality of switchable elements disposed downstream of the light source, such as diaphragms, chopper wheels, oscillating diaphragm segments or electronically drivable shutters, such as LCD shutters, in transmission or in reflection, for example with a rotating periodically segmented mirror. Both the form of the intensity profile of the light pulse and the pulse length and the duty ratio of the periodic variation can be adapted as desired by selection of the approach. This may be done for example by configuration of the transmission properties of oscillating or rotating diaphragms or by the setting of the switching speed of electronically controllable diaphragms.

Synchronization between the pulse frequency of the light source and the oscillation frequency of the optical element is to be understood to mean that the frequency of the periodically varied irradiation and that of the oscillating element are coordinated with one another so as to achieve a quasi-static state that is sufficiently stable for the imaging or illumination purpose. With regard to the frequency, this is the case if the frequency of the component oscillation is integer multiples of the frequency of the illumination, so that the following holds true:

$$v_{OE} = N v_L \text{ where } N \geq 1,$$

where $v_{OE}$ represents the oscillation frequency of the optical element, $v_L$ represents the pulse frequency of the light source and N represents an integer.

U.S. Pat. No. 6,700,952 B2 discloses causing the surface of a mirror to elastically oscillate and to produce a grating structure in this way, so that incident light is diffracted at a specific angle at the grating structure. The angle can be set by a suitable choice of the oscillation frequency. The device described in U.S. Pat. No. 6,700,952 B2 has the task of producing homogeneous illumination by continuously altering the oscillation frequency of the mirror. Therefore, synchronization of the oscillation frequency of the optical element with the pulse frequency of a light source is not provided, nor is it desirable. WO 02/093257 A2 describes a projection exposure machine for microlithography and an optical system wherein dynamic forces are introduced into at least one optical element in order to compensate for stress-birefringence-induced imaging aberrations. The dynamic forces are synchronized with a pulsed light source, such that optimum imaging conditions for the projection prevail at the instant of the influencing of the light beam of the light source by the optical element.

Furthermore, the document DE 100 40 813 A1 discloses forming a diffraction grating as a reflection grating having a variable grating constant, the variable grating constant being generated by surface waves on a surface of a surface wave structural arrangement. The diffraction grating provided in this way is used in a spectrometer for determining the wavelength of a radiation emitted by a radiation source to be measured.

In some embodiments, the disclosure provides a method in which changes in the imaging properties of the optical apparatus in the course of the operating period are compensated for with the aid of an optical element that is caused to oscillate, rather than by static deformation of an optical element as in the prior art. The wavefront profile of the light pulses can be dynamically corrected or influenced in a targeted manner by the optical element caused to elastically oscillate, in order to improve the imaging quality of the optical apparatus. It is likewise possible for the optical element caused to oscillate to induce distortions of the wavefront profile of the light pulses in a targeted manner, which then improve the imaging behavior of the optical apparatuses.

In order to compensate for the changes in the imaging properties of the optical apparatus, the oscillation frequency is chosen in accordance with the above equation such that at every instant at which a light pulse impinges on the optical element, the latter exhibits a deflection such that the resulting form of the optically active surface has a form which brings about a desired change in the wavefront.

However, the disclosure is not restricted to excitation in the optical element of oscillations that lead to a change in the form or the geometry of the optical element, rather longitudinal oscillations that lead to density variations, for example expansions and compressions, in the material of the optical element can also be excited in a suitably dimensioned optical element instead of or in addition to such transverse oscillations. Such density variations are accompanied by a local change in the refractive index, that is to say that when a longitudinal oscillation is excited, regions having different refractive indexes arise in the optical element, which enable the desired optical effect to be achieved. Optical elements which can be particularly suitable for the excitation of longitudinal oscillations are gas- or liquid-filled optical elements since density variations with a pronounced amplitude can be set in the elements. Longitudinal and transverse oscillations for changing the imaging properties of the optical system can also be excited in optical elements formed as a crystalline or amorphous solid.

Standing sound waves can be induced in the optical element, which leads to pressure or density variations in the optical element. In this case, the optical element acts as a resonance body for the induced oscillations, the form and extent of, and choice of material for, which resonance body can be adapted to the corresponding correction effect to be achieved in respect of the imaging aberrations of the optical apparatus. In this case, the oscillations can propagate in two or three dimensions of the optical element. The sound wave field that is brought about leads to a space-dependent compression or expansion of the material of the optical element, whereby a space-dependent change in the refractive index of the optical element is caused. Depending on the material of the optical element, for example only the isotropic refractive index of the optical element may be varied, which leads to a for example continuous influencing of the wavefront of the light pulse in the sense of a gradient-index lens, the pulse passing through the optical element caused to oscillate. This is the case particularly with low-viscosity liquids or gases. By contrast, if the material of the optical element is an amorphous or crystalline solid, then the sound pressure level can also be converted into a local change in the birefringence properties of the optical element and alter the polarization behavior, that is to say the polarization state and degree of polarization of the wavefront of the light pulse of the light source. In this way, the optical element can also be used as a spatially varying polarization-optical modulator by which the polarization state of the light can be manipulated in spatially resolved fashion. The ratio of the scalar refractive index change to the intensity of the induced birefringence can be controlled by appropriate choice of the medium.

Besides the correction of scalar wavefront aberrations of optical systems, polarization aberrations of optical systems can thus be compensated for. These occur for example for imaging systems or else illumination systems at short wavelengths in the DUV since crystalline solids are used as optical materials, which have intrinsic birefringence. The resulting polarization aberrations impair the imaging properties in the system and therefore have to be corrected. Crystals (e.g. $CaF_2$, quartz but also high-index materials such as spinel or LuAG, $BaF_2$, $BaLiF_3$, LiF) bring about for example in <100> orientation primarily rotationally symmetrical deviation and a fourth-order aberration. A third-order aberration profile is present in <111>. Furthermore, the optical layers (antireflection layers, etc.) applied to the lenses have a birefringent behavior. The reasons for this include a production-dictated anisotropy of the layers as a result of the vapor deposition process or else stresses introduced in the multilayer systems. They usually supply a rotationally symmetrical birefringence profile. The inhomogeneous radiation loading during operation of an exposure system can also lead to locally induced strains and therefore to introduction of bifringence, which have a generally complicated profile.

In this connection, the optical element can be configured as a parallelepipedal or circular plate having a suitable edge length or radius or else as a lens and to be produced from quartz glass, calcium fluoride, LuAG or else suitable birefringence liquids.

Because the sound wave oscillates temporally harmonically in the optical element and the temporally averaged refractive index change disappears, the light source can have a corresponding triggering in the form of a clock generator, for example an optical switch, whereby the pulse frequency and the oscillation frequency of the optical element are synchronized.

The method can not only designed to correct wavefront aberrations, but it can also be designed to correct intensity distribution and thus to the contrast of the imaging or, in the case of a projection exposure machine, to the feature size in the resist of the wafer.

Thus, by way of example, the correction may relate to the angular distribution of the intensity of the illumination. In a projection exposure machine, the angles of the illumination in the object plane can correspond to the loci of the pupil of the projection objective. The angular distribution of the illumination thus corresponds to the intensity distribution in the objective pupil. The intensity distribution in the exit pupil, which can be important for the imaging, may vary undesirably, for example in the form of a static apodization, for example as a result of nonideal layers, that is to say layers that do not act homogeneously over all angles (generally transmission in the case of lenses, reflection in the case of mirrors), but also as a result of temporal variation of the layer properties.

Furthermore, the intensity distribution can be spatially modulated by the combination of a polarization-optical modulator in the above-described sense with further polarization-optical elements (such as polarizers). By suitably arranging the elements one after another, the transmission behavior of the overall element can be spatially set and altered in a manner similar to the principle of liquid crystal displays.

The elements used in the illumination system enable a correction or an optimization of the imaging properties of the overall system which can be adapted to the individual, if appropriate also temporally unstable transmission properties of the optical arrangement in the case of the chosen illumination settings and the structures to be imaged. Depending on the structure, the orders of diffraction pass through different optical paths in the projection objective and result in superpositions/interference according to the local transmission properties/variations with different intensities at the image location. Accordingly, the superposed intensities determine the imaging contrast and thus the "width" of the structure imaged in the resist (threshold value behavior of the resist). The uniformity of the imaged feature sizes over the entire image field (CD uniformity) is an important variable besides the resolution.

In this way, a considerably higher flexibility for the image aberration correction is afforded by comparison with the methods and devices known from the prior art for compensating for image aberrations that arise for example in the course of the operation of a projection objective. The fact that it is possible to select from a multiplicity of oscillation modes of the optical element means that it is also possible to compensate for higher-order image aberrations than in the case of purely static deformation of the optical element, in which higher orders can be compensated for only with a considerable outlay. Since it is possible to change over between different oscillation modes as desired, it is also possible to take account of the fact that a change in the image aberrations occurs in the course of operation.

By choosing the oscillation frequency of the optical element in a manner phase-shifted with respect to the pulse frequency of the light source, the intensity of the optical effect can additionally be set in a manner dependent on the phase difference.

In certain embodiments, the oscillation of the optical element is excited as a superposition of oscillations with different integer multiples of the pulse frequency in order thus to set periodically modulated imaging properties in the optical element which lead to a higher-order optical effect. Since each eigenmode of an oscillation of an optical element has a characteristic eigenform that is dependent only on the geometry of the optical element and the boundary conditions, this can be controlled by the excitation in terms of its amplitude and phase but not in terms of its form. In order, then, to obtain the desired optical effect, it is possible to superpose a plurality of eigenmodes whose eigenfrequencies are integer multiples of the laser frequency, with suitable amplitude or phase in order to set the desired optical effect function. In other words, the desired optical effect function is developed according to eigenforms of the oscillation modes whose eigenfrequencies are harmonic with respect to the pulse frequency. In practice, the geometry of the optical element will be designed such that the eigenforms correspond to the desired correction functions and their eigenfrequencies coincide with the harmonics of the pulse frequency.

In this connection, the different integer multiples of the pulse frequency can be assigned a respective individual phase shift, in which case the phase shifts can be set in a variable manner, and/or for the different integer multiples of the pulse frequency to be assigned a respective dedicated oscillation amplitude, which likewise can be set in a variable manner. The phase shifts and/or amplitudes which are assigned to the different integer multiples of the pulse frequency may differ among one another and/or with respect to the pulse frequency. It may furthermore be advantageous to choose the temporal phase such that the pulse impinges on the optical element at the turning point of the oscillation process, since here the temporal change in the eigenform over the pulse width is the smallest and, consequently, the best approximation of a temporally steady-state optical effect can be achieved.

In some embodiments, a clock generator is provided for the abovementioned purposes for the pulse frequency of the light pulses, the clock generator in turn being connected to at least one frequency multiplier and at least one phase shifter element, the output of which is connected to the apparatuses for the excitation of an oscillation. In this case, the clock generator signal is firstly fed to the frequency multiplier, which generates a signal representing an integer multiple (for example 1-, 2-, 3-, 4-, . . . -fold) of the pulse frequency. The phase shifter element adds a specific phase shift, which may also be zero, to the signal. The variable amplification element controls the amplitude of the oscillation, which may likewise be zero. The signal generated in this way is then fed to the apparatuses for the excitation of an oscillation of the optical element in order to excite the optical element correspondingly to oscillate.

In some embodiments, a clock generator is provided for the abovementioned purposes which generates a multiple of the light source clock frequency. The clock frequency for the light source and for the excitation of the optical elements is generated from one or a plurality of phase-synchronous frequency dividers and adapted by adjustable phase shifters and amplifiers as desired.

In order to excite the above-described plurality of oscillation eigenmodes of the optical element, a plurality of frequency multipliers and phase shifter elements can be connected to the clock generator, and their outputs are connected to a summation element, the output of which is connected to the apparatuses for the excitation of an oscillation. In the case of this refinement, a plurality of frequency-multiplied and, if appropriate, phase-shifted signals of the clock generator are accordingly summed to form a control signal that is then used to excite the optical element in a desired manner to oscillate, wherein the oscillation represents a superposition of oscillation eigenmodes by which the desired optical effect can be obtained.

In certain embodiments, the optical element includes birefringement material, whereby a degree of polarization and also a polarization state of the wavefront of a light pulse that passes through the optical element caused to oscillate can be influenced in a targeted manner given a suitable synchronization of pulse frequency and oscillation frequency.

In some embodiments, the optical element can also be constructed in multilayer fashion in that, by way of example, the optical element includes a liquid or gas layer between two solid layers, wherein the liquid or gas layer or at least one of the two solid layers can be excited to oscillate.

In order to correct distortion profiles, the optical element can be arranged in the region of a field plane of the optical apparatus. In order to correct field-independent aberrations, so-called aperture aberrations, the optical element is provided in the region of a pupil plane of the optical apparatus.

In a projection exposure machine appertaining to microlithography, it is possible to provide the optical element in the projection objective for image aberration correction at all those positions at which correction elements may be provided. These can be pupil planes and field planes, but also positions between pupil plane and field plane. An optical element that can be excited to oscillate for changing intensity profiles in a targeted manner can also be used in the illumination system of a projection exposure machine. What can be particularly suitable as mechanisms for generating elastic oscillations of the optical element are apparatuses such as loudspeakers (plunger-type coils, Lorenz motor), piezoactuators, electrostatic or magnetostatic actuators/drives (motors of different constructional designs) or else hydraulically or pneumatically controlled actuators. It goes without saying that it is also possible to combine a plurality of different mechanisms for generating elastic oscillations with one another.

It is advantageous to arrange such apparatuses for the excitation of oscillations in the shading region of the optical element. Shading region here and hereinafter denotes that region of the optical element onto which no light from the light source falls during operation. In this way, the passage of the operational light—the projection radiation in the case of a projection exposure machine—and correspondingly the imaging are not adversely affected.

Such a shading region may be the periphery of the optical element. Insofar as is envisaged by the optical design of the optical apparatus, the optical element may also have a central middle hole in which are arranged further apparatuses for generating oscillations. This makes it possible to excite an even higher number of oscillation modes. Such a hole for engagement of mechanisms for generating oscillations may also be arranged in decentered fashion, that is to say with an offset relative to the optical axis.

In order to prevent adjacent optical elements from likewise being excited to oscillate, it is advantageous for the apparatuses for generating oscillations and the oscillating optical element itself essentially to be decoupled relative to the surroundings. Such oscillation decoupling may advantageously be effected by compensation elements that oscillate in antiphase with respect to the excitation of the optical element.

In some embodiments, the decoupling may be effected by avoiding a mechanical connection between the oscillating optical elements and further static optical elements of the objective. This is possible, for example, by providing a first carrier structure for the static optical elements and a second carrier structure, which is separate or decoupled from the first carrier structure, for the oscillating optical elements.

In certain embodiments for decoupling avoids an undesirable transmission of force by the oscillating optical element to the surroundings by generating compensation oscillations. This may be effected for example by one or more compensation elements that oscillate correspondingly in antiphase in order thus to compensate for the oscillation of the oscillating optical element.

The optical element that is to be excited to elastically oscillate may be a plane plate. In this case, the optical element can be configured to be mechanically stiff, that is to say thick, for example, since high-frequency modes whose frequency is at the laser frequency or one of the multiples can be found relatively simply as a result of this. The optical element can furthermore be configured to be thin. In this case, predominantly the relatively high-frequency longitudinal modes are appropriate in the case of thin optical elements, for example thin plates, in order to set a multiplicity of even higher oscillation modes and, consequently, to correct higher-order image aberrations.

The optical element can be embodied as at least one partial space of the optical apparatus which is filled with gas or generally a fluid. The gas in the partial space is caused to oscillate by the apparatuses for generating an oscillation in the form of sound generators (for example microphones), whereby local density variations bring about a local refractive index change in the gas. If a light pulse synchronized with the sound wave impinges on the partial space, then the wavefront of the light pulse experiences an alteration which can lead to an improvement in the imaging behavior of the optical apparatus.

In some embodiments, the optical apparatus has at least two optical elements which are spaced apart from one another and between which is arranged an interspace with gas or liquid. In the case of such a refinement of the optical apparatus, one of the two optical elements, both the optical elements and/or the interspace with gas or liquid can be excited to oscillate. In the case where a first optical element of the two optical elements is embodied in electrically insulating fashion and a second optical element of the two optical elements is embodied in electrically conductive fashion, it can firstly for charges to be induced locally onto the first optical element, and then for the interspace with gas or liquid to be excited to oscillate.

In certain embodiments, the optical element that can be caused to oscillate is configured such that its elasticity properties are not constant over the entire optical element, but rather vary locally. Elasticity properties are to be understood for example to mean stiffness or damping behavior of the optical element. This may be achieved in the case of a transmitting optical element, for example, by virtue of the optical element having a thickness that varies locally from the center toward its edge. The thickness of an optical element is to be understood to mean the distance between its two optical surfaces, the distance being measured parallel to the optical axis.

Spherical or aspherical lenses or optical elements with a freeform surface, by way of example, have such a locally varying thickness.

Optionally, locally varying elasticity properties can also be achieved through a suitable material configuration of the optical element, for example by virtue of the optical element having a density that varies locally from its center toward its edge.

In one further development, the optical element may be held by a carrier device, the carrier device having locally varying elasticity properties. Optionally, an array of optical elements connected to one another by connecting elements may also be provided, it being possible for the connecting elements each to have different elasticity properties.

The carrier element can be configured such that eigenmodes of the oscillations have the desired form in the optically used region of the optical element.

These embodiments can make it possible to generate oscillation modes coordinated precisely with the aberrations to be corrected. As a result of the local variation of elasticity properties, the setting of these oscillation modes becomes even significantly more flexible in comparison with an oscillating optical element having homogeneous elasticity properties.

In addition to lens arrays, arrays of mirrors or gratings or combinations of lenses and mirrors may also be provided in some embodiments with flexible connecting elements. In certain embodiments, it is also possible to configure such an optical element as an array of flat, such as plane-parallel, lens segments that refract in sections and/or in zones. Such an array may be used as a Fresnel lens. In the case of the arrays of lenses, mirrors, gratings or flat lens segments, the individual components of the array may have identical or else in each case different geometries. The provision of different geometries for the individual components additionally increases the flexibility of the oscillating optical element with regard to image aberration correction or influencing of the wavefront.

When using an oscillating lens array with flexible connecting elements, the focus positions of the individual lenses are influenced in a targeted manner by selection of a suitable oscillation mode. It is thereby possible to influence for example angles or intensities of the beam bundles passing through. A specific application of such an angle-influencing oscillating lens array is possible in the illumination system of a projection exposure machine in order to set illumination settings in a targeted manner. An illumination setting in a projection exposure machine is understood to mean the angular distribution of the intensities of the illumination beams upon impinging on the reticle, corresponding to the angular distribution in a field plane. The setting of illumination settings with the aid of such an oscillating lens array has the advantage that different illumination settings can be optionally set by a choice of different oscillation modes. This means that changing over the illumination setting does not involve changing over optical elements or inserting diaphragms or filters. Instead, it suffices to set a different oscillation state.

An oscillating lens array may also be used for the fine correction of an illumination setting which is set by other mechanisms that are known from the prior art.

All of the optical elements or arrays of optical elements that can be excited to oscillate as described here can be used together with a control unit in an some embodiments when used in an optical apparatus, such as in a projection exposure machine for photolithography. The control unit is equipped with a measuring system, which locally determines predetermined control parameters of the oscillating optical element or of the array, for example the phase or the amplitude of the oscillation. For characterizing an individual optical element, the measuring system may include for example an interferometer with clocked illumination or an arrangement of microphones or acceleration sensors which register the pressure fluctuations or acceleration of the optical surfaces in spatially resolved fashion. For characterizing an array of optical elements, the measuring system in some embodiments includes individual sensors, for example focus sensors, which determine the focus position of the individual array components. The control unit is furthermore provided with an evaluation and control system which controls the apparatuses for the excitation of oscillations of the optical element on the basis of the measured values recorded by the measuring system, if appropriate by comparing the measured values with predetermined parameters from model calculations. In this way, the accuracy of the oscillation amplitude of the oscillating optical element or array and the corresponding synchronization with the pulsed light source can be set particularly precisely.

Such a control unit may be provided for an individual oscillating optical element, for a plurality of such elements simultaneously or else for the entire optical apparatus. In addition or as an alternative, provision may also be made of a wavefront sensor that records the wavefront of the entire optical system. The data determined by the wavefront sensor are likewise processed by the control unit and used for defining or setting the oscillation modes or oscillation amplitudes of the optical element that are desired for the correction. For characterizing the overall system, use can be made of a wavefront sensor or an interferometer, optionally an interferometer with a plurality of measuring channels operating in parallel for synchronous measurement at a plurality of field points, for example a multichannel shearing interferometer.

In an apparatus having one or more oscillating optical elements, one advantage of the characterization and control of each individual one of the elements is that individual deviations of the individual optical elements from model calculations based on an ideal optical element can be taken into account and compensated for. However, characterization and control are also advantageous on the overall system since, with the aid of a sensor that detects the characteristic of the entire optical system, the interaction of the individual oscillating components can be determined and the desired effect can be set in a targeted manner in the overall system.

In certain embodiments, the control system furthermore includes a synchronization system for synchronizing the oscillation frequency of the optical element with the pulse frequency of the light source. The synchronization is effected on the basis of the parameters for the oscillation excitation that are determined by the measuring and evaluation system and on the basis of the predetermined pulse frequency of the light source.

In addition to one or more oscillating optical elements, further manipulatable optical elements, such as displaceable or tiltable and statically deformable optical elements, may also be provided in an optical system. In this case, too, it is advantageous to control both the mechanisms for the excitation of the oscillation of the oscillating optical elements and the actuator system of the further manipulatable elements by a control unit provided with a measuring system including both sensors for determining parameters of the individual optical elements and sensors for determining parameters of the overall system.

In order to achieve the correction or improvement of the imaging properties of the overall system in a targeted manner, it is possible to measure the intensity distribution in the exit pupil of the overall system including illumination system and imaging system (projection objective), instead of, by way of example, only separately measuring and separately correcting the intensity distribution of the illumination system. The correction values resulting on account of the measurement of the intensity distribution of the exit pupil then serve for correcting the cumulative contributions from illumination system and imaging system, it then being possible for the correction to be performed in the illumination system.

If the optical element is operated in reflection, in certain embodiments provision may be made for using a liquid medium having a reflective surface as a mirror.

If a plurality of optical elements that can be excited to oscillate are provided in an optical apparatus, the possibility of compensating for even more complicated image aberrations than with only one oscillating optical element is afforded by suitable positioning within the optical apparatus and by suitable setting and combination of the respectively excited oscillation modes.

The disclosure is explained in more detail with reference to the drawing.

Figure 2:
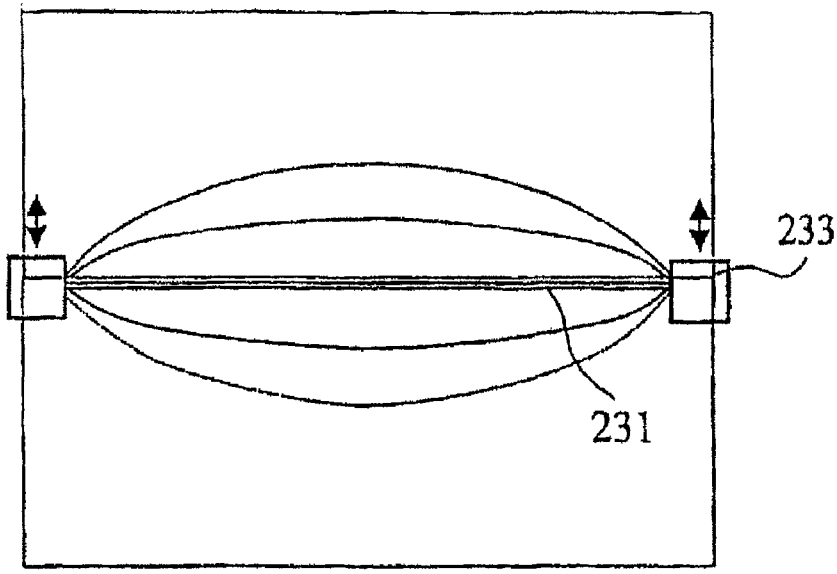
Figure 3:
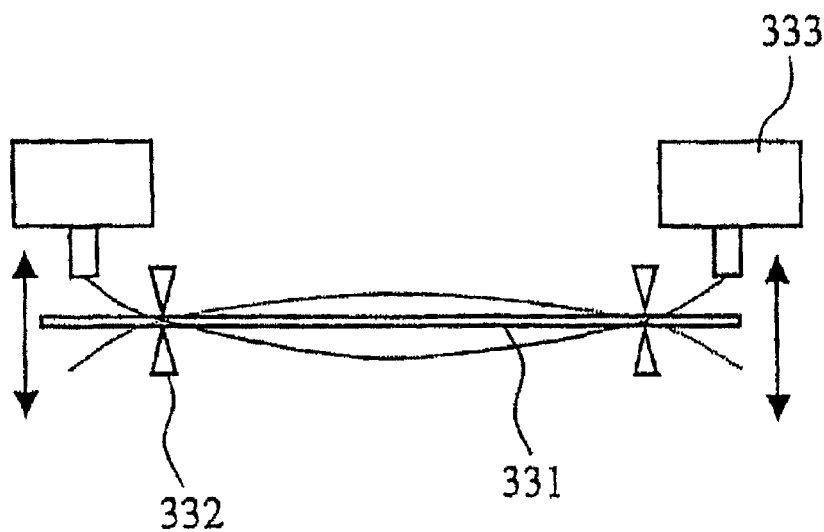
Figure 4:
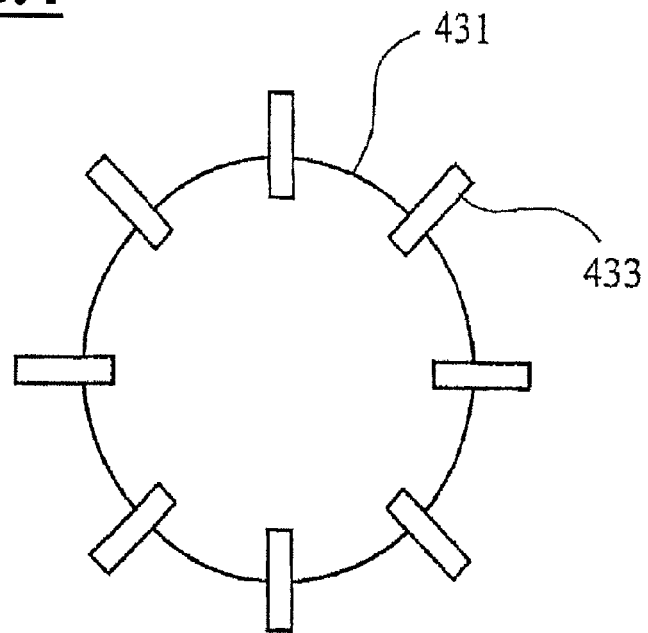
Figure 5:
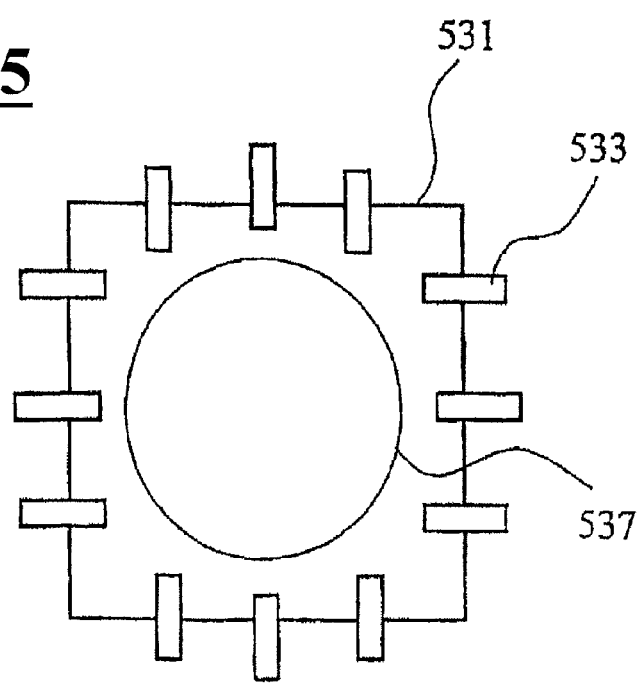
Figure 6:
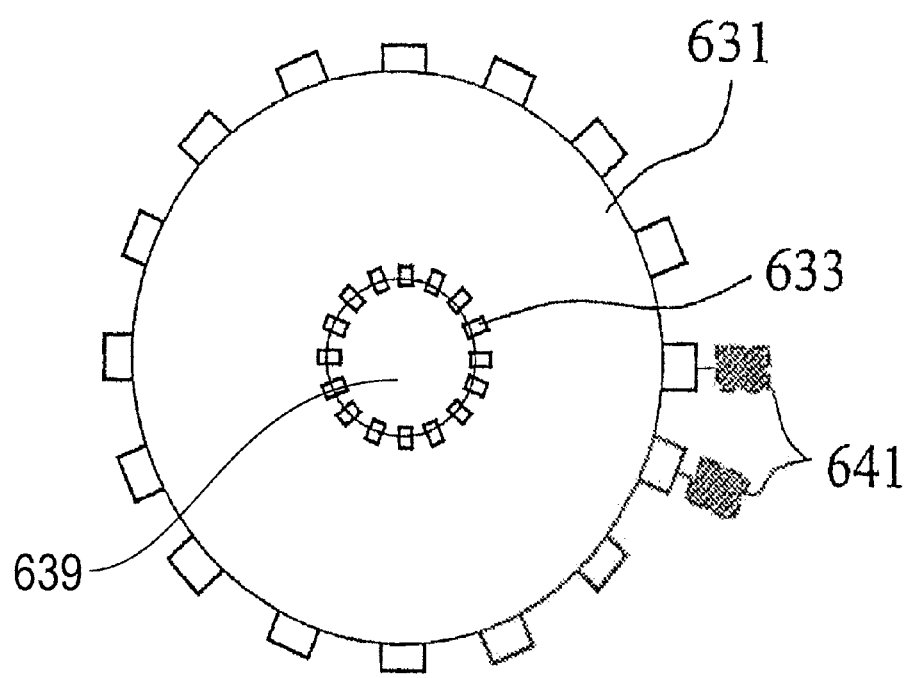
Figure 7:
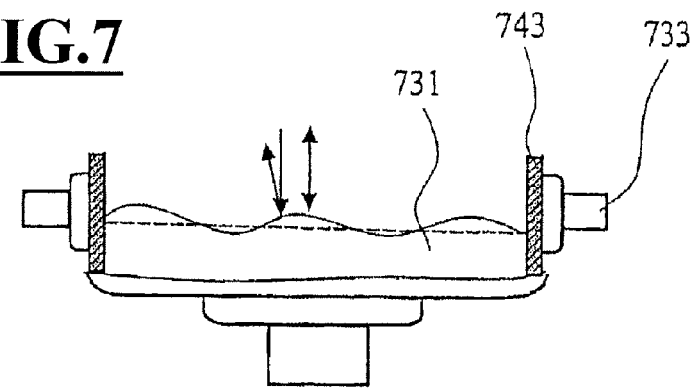
Figure 8:
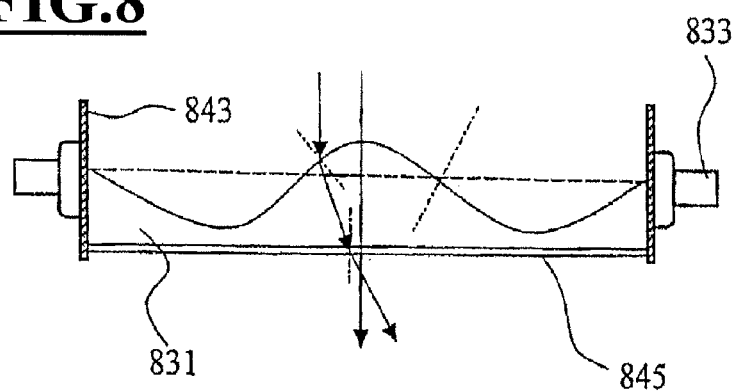
Figure 9:
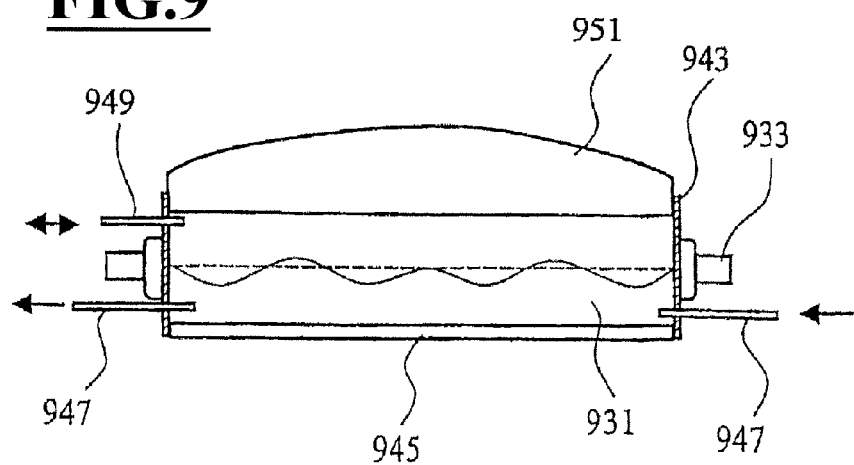
Figure 10:
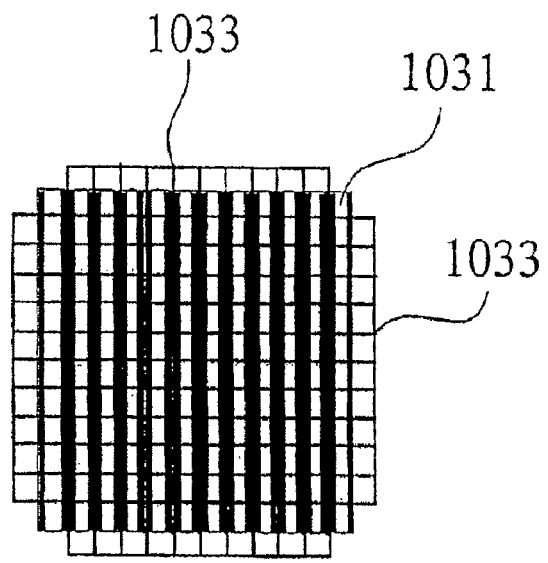
Figure 11:
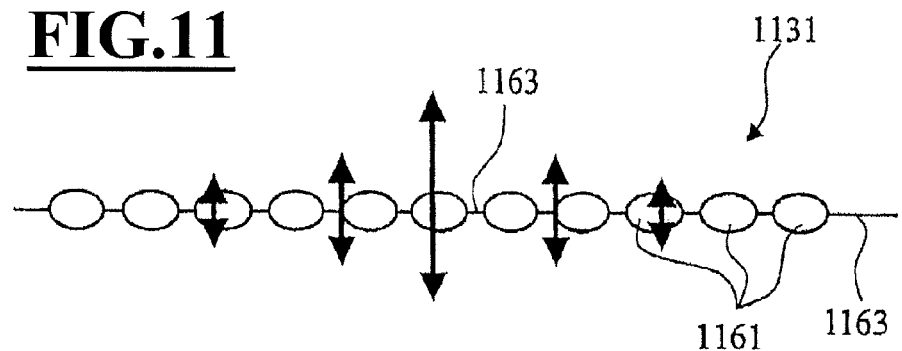
Figure 12:
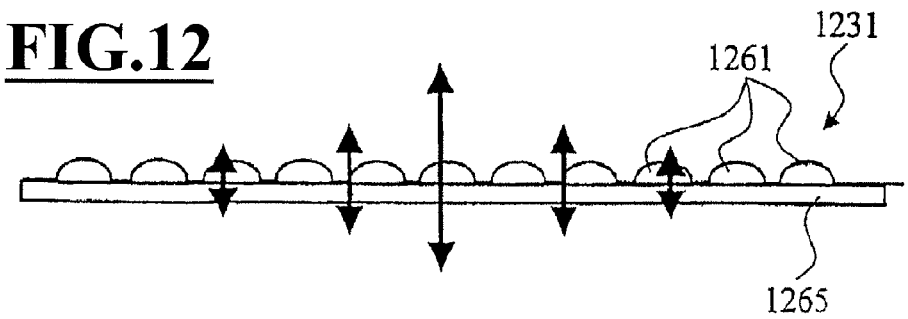
Figure 13:
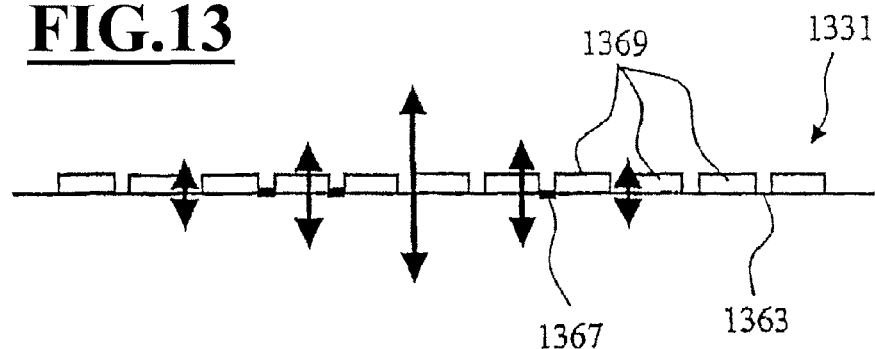
Figure 14:
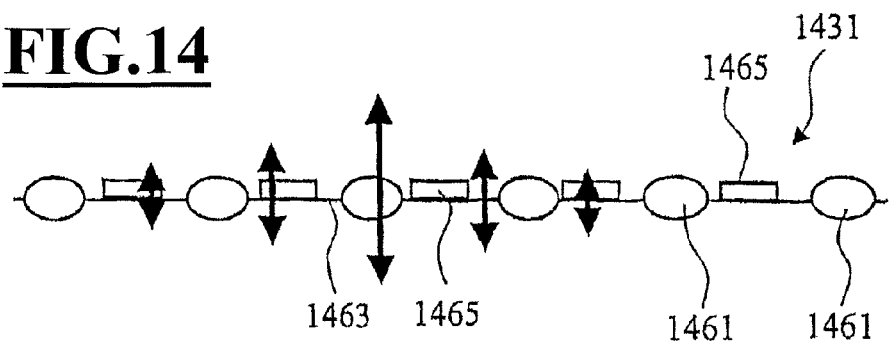
Figure 15:
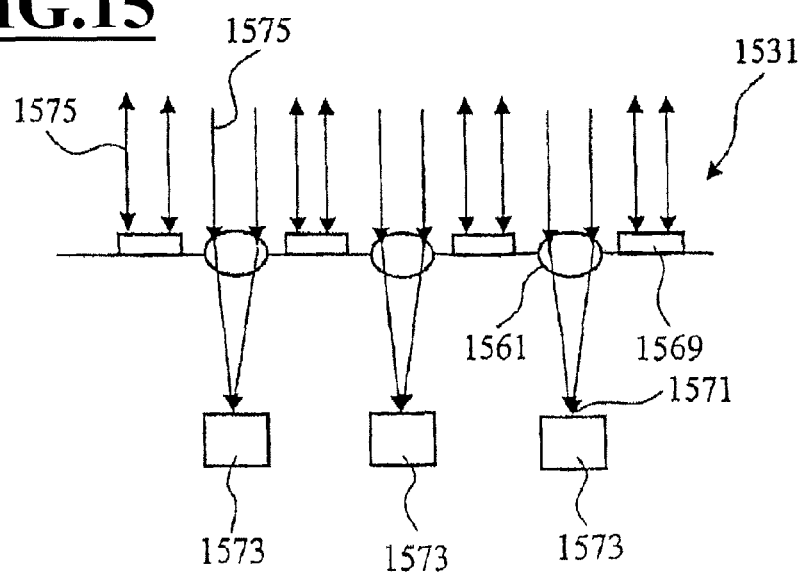
Figure 16:
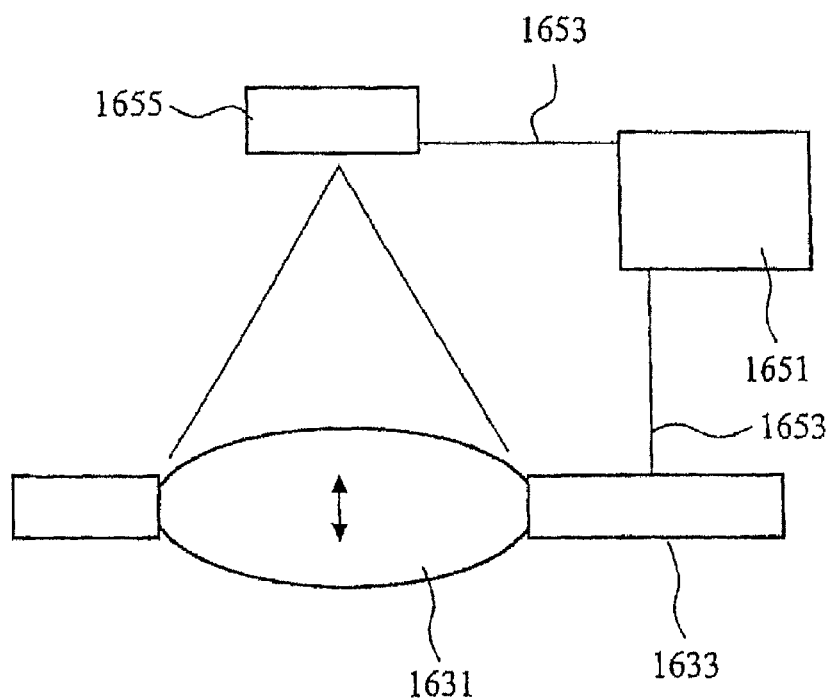
Figure 17:
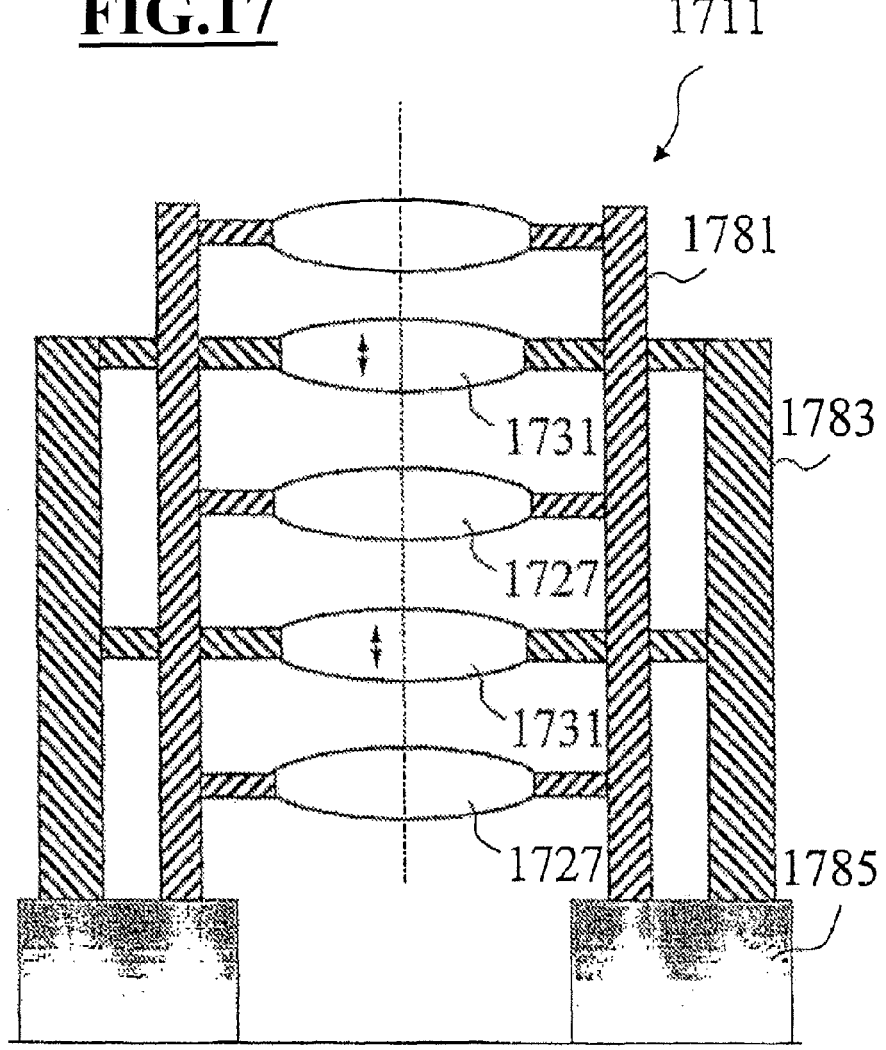
Figure 18:
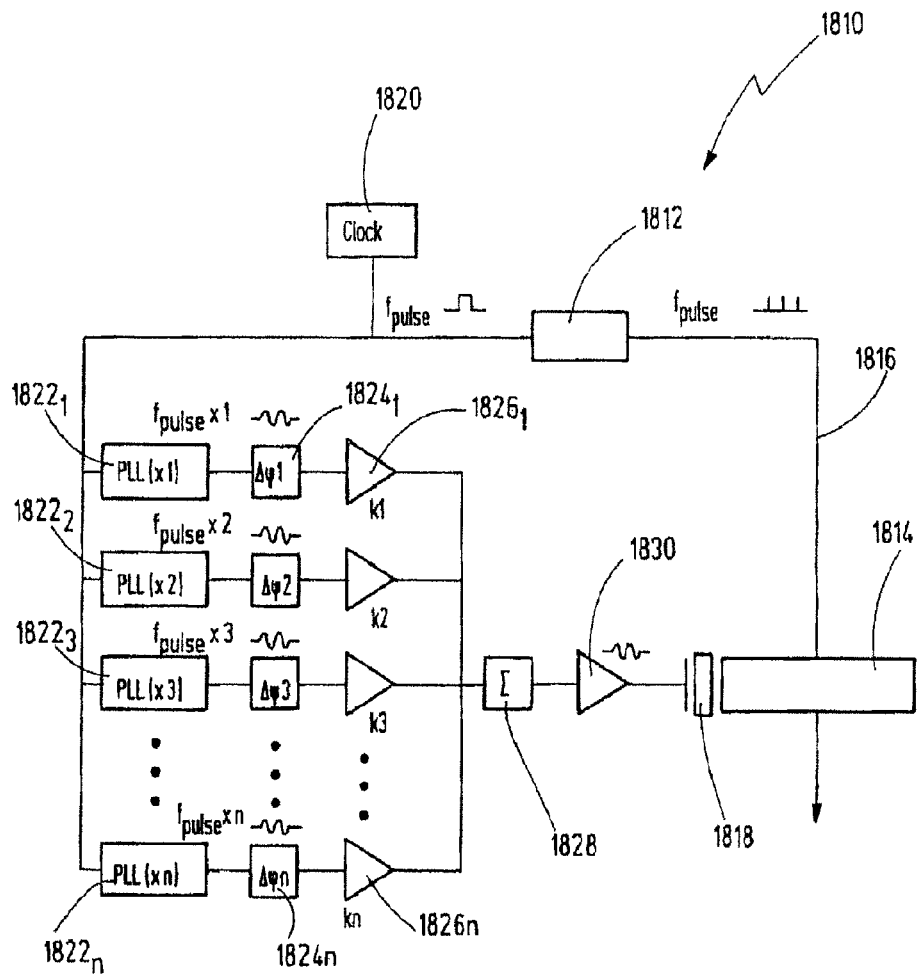
Figure 19:
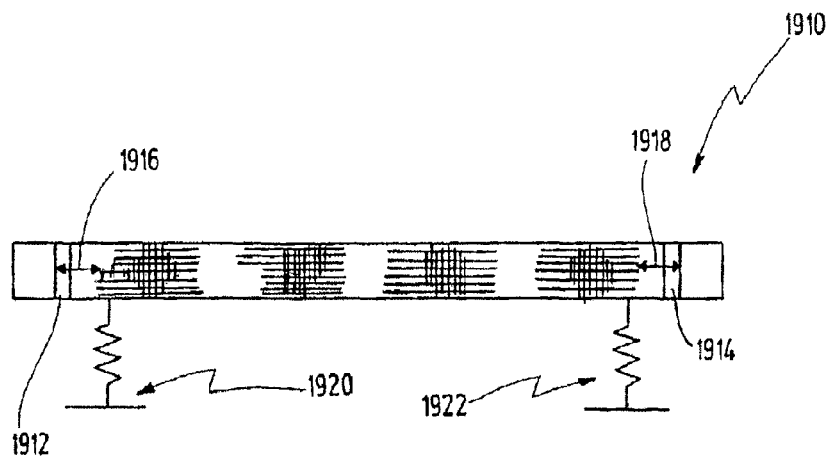
Figure 20:
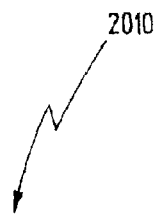
Figure 21:
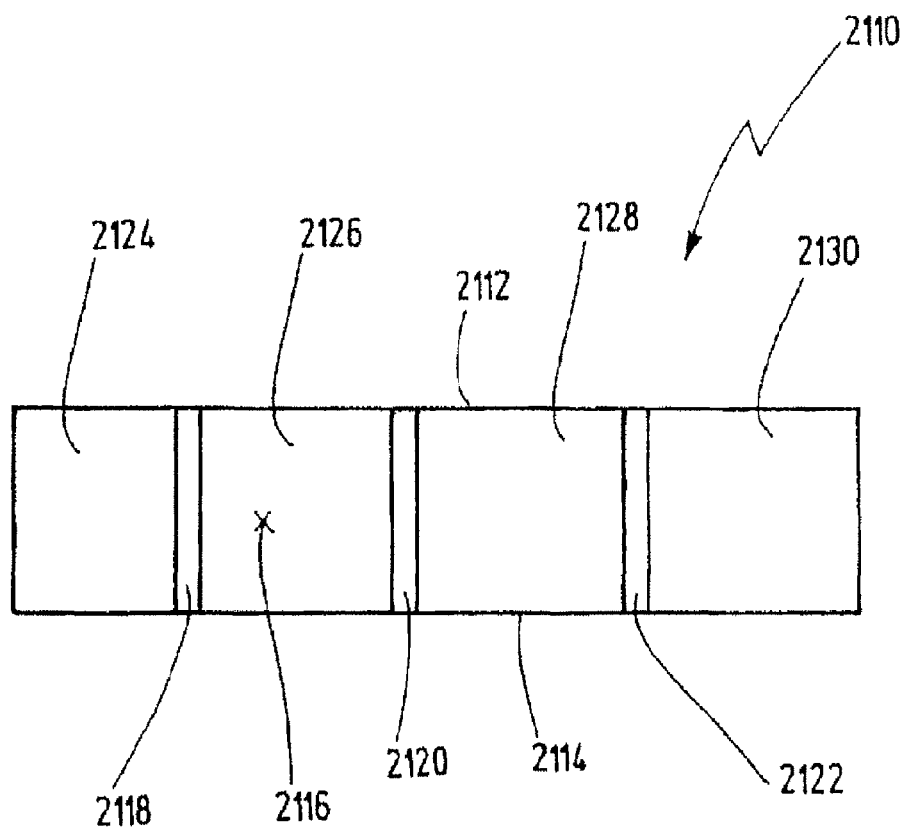
Figure 22:
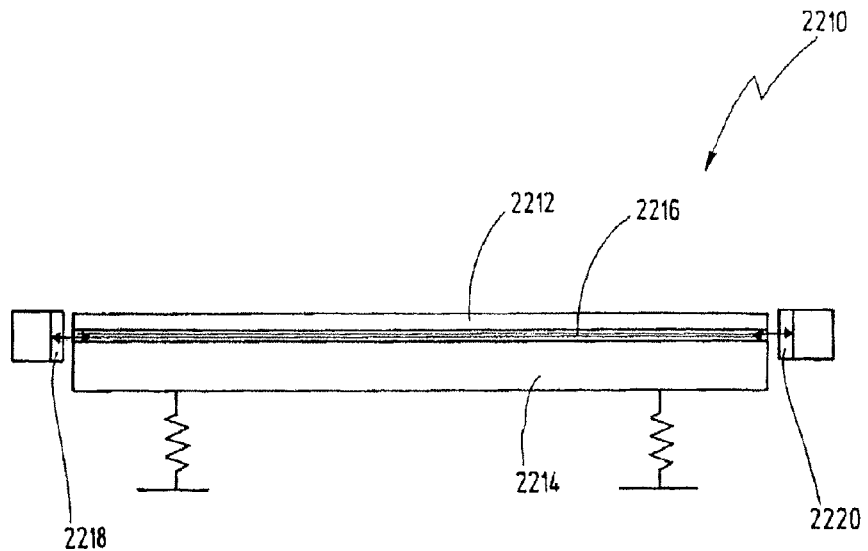
Figure 23:
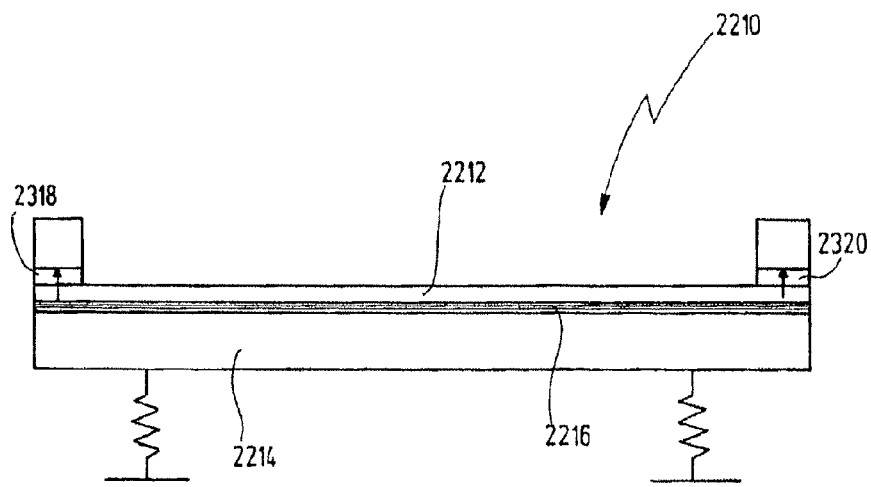
Figure 24:
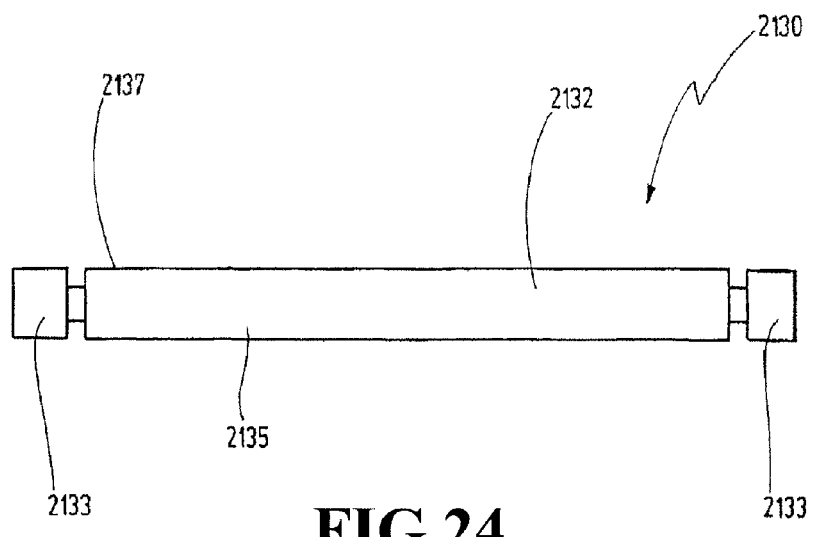
Figure 25:
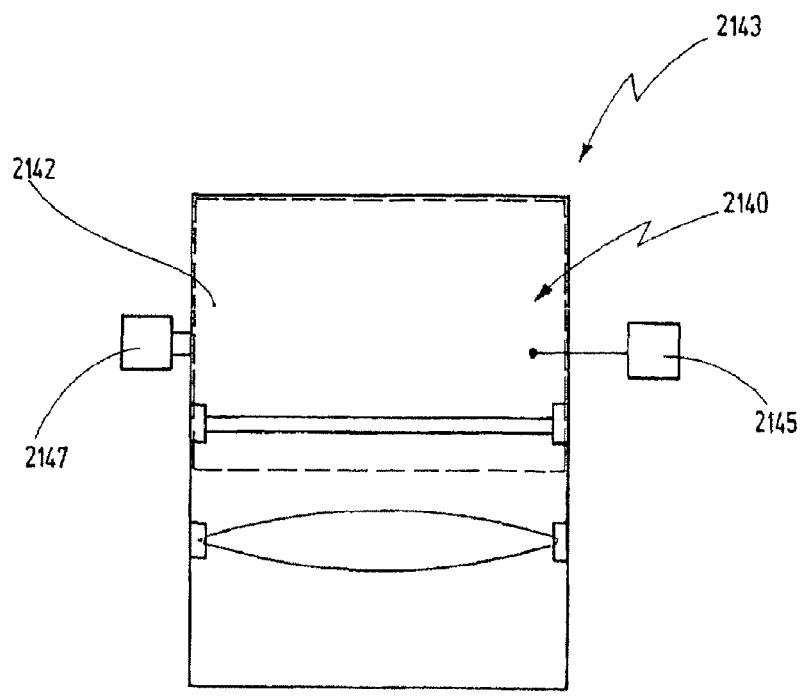
Figure 26A:
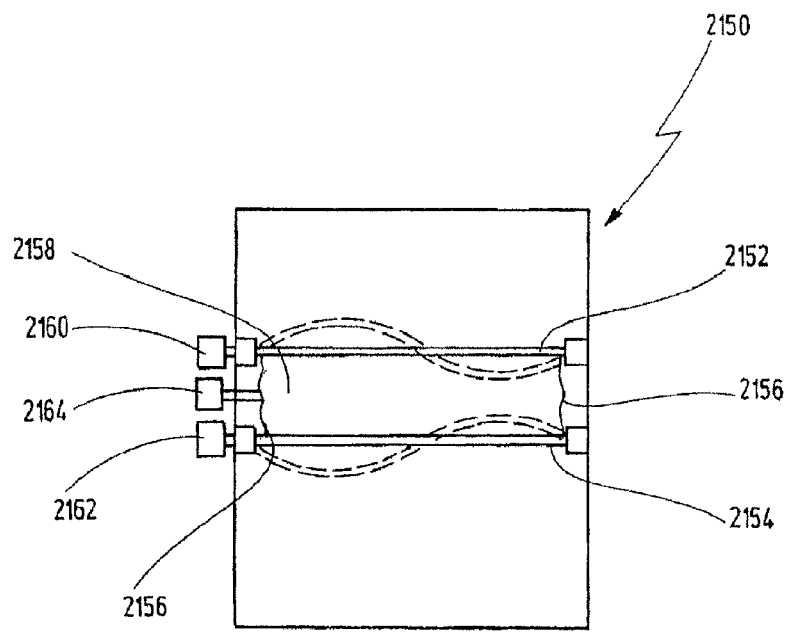
Figure 26B:
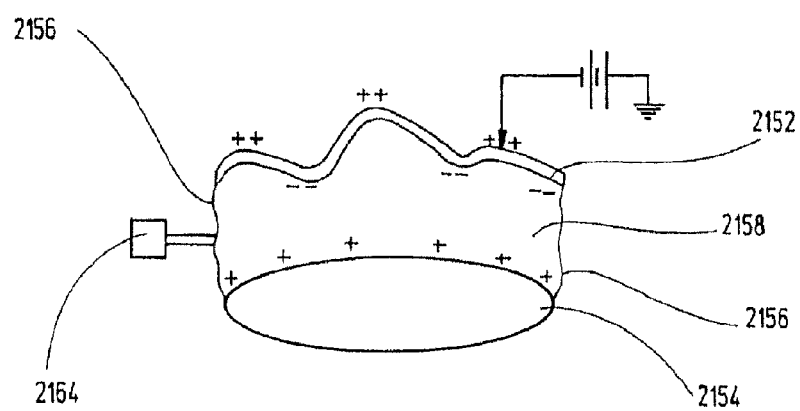
Figure 27A:
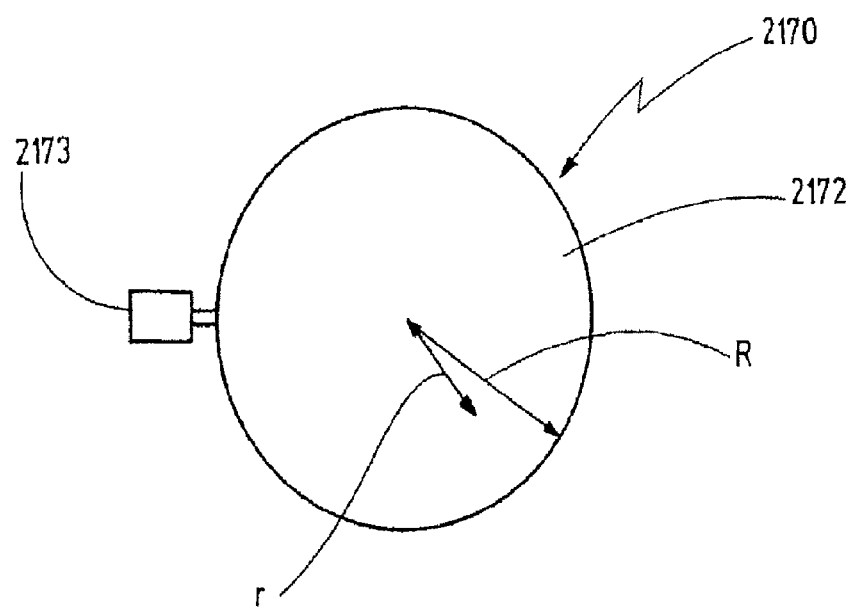
Figure 27B:
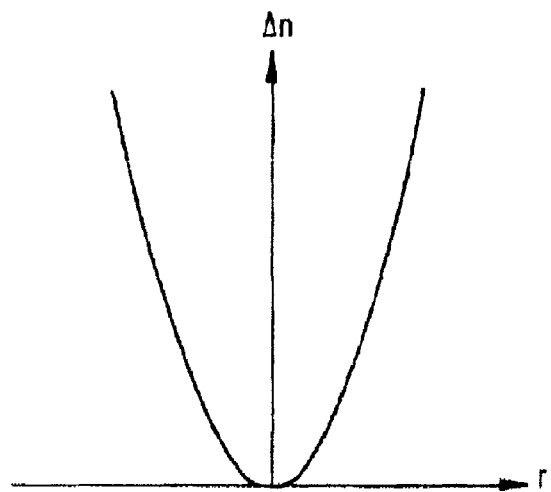

FIG. 1 shows a schematic illustration of a projection exposure machine with a projection objective;

FIG. 2 schematically shows the oscillation of a thin plane plate with a simple oscillation mode and with driving force at the fixing location for the plane plate;

FIG. 3 schematically shows the oscillation of a thin plane plate with a simple oscillation mode and with driving force outside the fixing;

FIG. 4 schematically shows a round optical element with eight actuators;

FIG. 5 schematically shows a rectangular optical element with twelve actuators;

FIG. 6 schematically shows a round optical element with a central middle hole and actuators on the periphery of the optical element and within the middle hole;

FIG. 7 schematically shows an embodiment of the optical element as liquid in reflection;

FIG. 8 schematically shows an embodiment of the optical element as a liquid lens in transmission;

FIG. 9 schematically shows an embodiment of the optical element as a liquid lens with sealed-off surroundings;

FIG. 10 schematically shows an embodiment of the optical element as a grating;

FIG. 11 schematically shows an embodiment with a lens array;

FIG. 12 schematically shows an embodiment with a lens array on a carrier;

FIG. 13 schematically shows an embodiment with a mirror array;

FIG. 14 schematically shows an embodiment with an array of mirrors and lenses;

FIG. 15 schematically shows an embodiment with a mirror and lens array in combination with focus sensors;

FIG. 16 schematically shows a measuring and regulating concept for an individual optical element;

FIG. 17 schematically shows an objective with a mechanical decoupling of optical elements that can be caused to oscillate, and static optical elements;

FIG. 18 shows a basic circuit diagram of a control of the excitation of an oscillation of an optical element in synchronization with the pulse frequency of a light source;

FIG. 19 schematically shows a further exemplary embodiment of the optical element that can be excited to oscillate with lateral (longitudinal) oscillation excitation;

FIG. 20 schematically shows a further optical element with transverse oscillation excitation;

FIG. 21 schematically shows a further exemplary embodiment of an optical element in the form of a gas resonator for the excitation of longitudinal oscillation modes;

FIG. 22 schematically shows yet another embodiment of the optical element as a multilayer plane-parallel plate with lateral (longitudinal) oscillation excitation;

FIG. 23 shows the optical element in FIG. 22 with transverse oscillation excitation;

FIG. 24 schematically shows yet another embodiment of the optical element as a mirror;

FIG. 25 schematically shows yet another embodiment of the optical element as a gas-filled partial space of the optical apparatus;

FIGS. 26A, 26B schematically show an arrangement of two optical elements between which a gas layer is arranged; and FIGS. 27A, 27B schematically show yet another embodiment of the optical element as a polarization-influencing plane-parallel plate and the refractive index dependence thereof on the radius.

FIG. 1 schematically shows a microlithographic projection exposure machine 1 provided for the fabrication of large scale integrated semiconductor components by photolithography. The projection exposure machine 1 includes, as a light source, a pulsed excimer laser 3 having an operating wavelength of 193 nm. Optionally, light sources having other operating wavelengths, for example 248 nm or 157 nm, or a plasma source having a wavelength of 13.4 nm could also be used, exclusively mirrors instead of lenses being used at a wavelength of 13.4 nm. A downstream illumination system 5 generates, in its exit plane or object plane 7, a large, sharply delimited, very homogeneously illuminated illumination field adapted to the telecentricity properties of the downstream projection objective 11. The illumination system 5 has devices for controlling the pupil illumination and for setting a predetermined polarization state of the illumination light. In particular, an apparatus is provided which polarizes the illumination light such that the oscillation plane of the electric field vector runs parallel to the structures of the mask 13.

A device (reticle stage) for holding and moving a mask 13 is arranged in the beam path behind the illumination system such that the mask lies in the object plane 7 of the projection objective 11 and can be moved in a traveling direction 15 in the plane for scanning operation.

Behind the object plane 7, which is also designated as mask plane, there follows the projection objective 11 which images an image of the mask on a reduced scale onto a substrate 19, for example a silicon wafer, covered with a photoresist, also called resist 21. The substrate 19 is arranged such that the planar substrate surface with the resist 21 essentially coincides with the image plane 23 of the projection objective 11. The substrate is held by a device 17 including a drive in order to move the substrate 19 synchronously with the mask 13. The device 17 also includes manipulators in order to move the substrate 19 both in the z direction parallel to the optical axis 25 of the projection objective 11 and in the x and y directions perpendicular to the axis. A tilting device having at least one tilting axis running perpendicular to the optical axis 25 is integrated.

The device 17 (wafer stage) provided for holding the substrate 19 may be constructed for use in immersion lithography. In this case, a liquid is introduced into the interspace between the last optical element of the projection objective 11 and the substrate 19. Apparatuses for feeding in and discharging the immersion liquid and also a liquidtight receptacle container for fixing the liquid between the substrate 19 and the last optical element are correspondingly provided in a projection exposure machine adapted for immersion lithography.

The projection objective 11 includes optical elements 27, 29, to which radiation is applied asymmetrically. The non-rotationally symmetrical irradiation of the optical elements leads to the alteration of the imaging properties of the optical elements 27, 29 and correspondingly of the entire objective over the course of the operating period. In order to compensate for such image aberrations that arise due to aging, an optical element 31 is provided in the projection objective 11, which optical element can be caused to elastically oscillate by a series of piezoactuators 33 arranged on the periphery of the optical element 31. A control unit 35 is provided for the control of the piezoactuators 33. For the excitation of the optical element 31, it is also possible to use, besides piezoactuators, pneumatically or hydraulically controlled actuators, and acoustic excitation is also possible.

A sensor 55, which records the wavefront of the overall system, is arranged in the wafer stage 17. The sensor 55 can be a wavefront sensor or as an interferometer. The interferometer has a plurality of measuring channels operating in parallel for synchronous measurement at a plurality of field points. The measurement results are transmitted to a control computer 51 via data lines 53. The control computer 51 determines, from the measurement data, the image aberrations arising during the operating period and determines, on the basis of this information, an oscillation mode for the optical element 31 that leads to an optimum compensation of the image aberrations. The control computer is connected to the control unit 35 for the optical element and also to the light source 3 via data lines 53. In this way, the control computer, via the control unit 35, not only regulates the oscillation excitation of the optical element with the aid of the actuators 33 but at the same time serves for synchronizing the oscillation of the optical element with the pulse frequency of the light source.

FIG. 2 schematically shows the method of operation of the oscillating optical element 231. Here the optical element 231 includes a thin plane plate or a membrane. The membrane is caused to oscillate by drives 233 arranged at the fixing points of the optical element 231. In a simple case, the drives may be arranged for example such that a cylindrical deformation of the optical element 231 arises during the oscillation. If individual light pulses, for example from a pulsed laser light source, are then incident on the optical element 231, and if the pulse frequency of the laser corresponds to the oscillation frequency of the optical element 231 or to an integer multiple thereof, the optical element 231 has the same form upon each impingement of a light pulse. In terms of the effect, this corresponds to a static optical element with a corresponding cylindrical form.

The intensity of the optical effect may essentially be set by two effects, namely by the oscillation amplitude of the optical element 231 and the phase difference between the pulse frequency and the oscillation frequency of the optical element 231. If the light pulses impinge in each case precisely at the instant of maximum deflection, the optical effect corresponds to a maximally curved static optical element. If the light pulses impinge in each case at a different instant at which the oscillating optical element 231 exhibits less pronounced deflection, the optical effect corresponds to an optical element that is curved to a correspondingly lesser extent. The effect of an optical element with a curvature having an opposite sign may be achieved by choosing the phase shift between pulse frequency and oscillation frequency of the optical element to be greater than half an oscillation period.

Optionally, the driving force may also be introduced outside the fixing of the optical element 227. This is illustrated schematically in FIG. 3.

Various eigenmodes and thus a wide variety of deformations of the optical element 331 can be set by the form of the optical element 331, by the arrangement, number and position of the bearing points 332 and the actuators 333, and also by the excitation frequency.

FIGS. 4 to 6 thus show by way of example various forms of the optical element 431 that can be caused to oscillate. FIG. 4 shows a round optical element 431 with eight actuators 433 arranged along its periphery. The eigenmodes of circular plates or membranes and their calculation and modeling are known to the person skilled in the art of mechanics. Therefore, they will not be discussed any further at this point.

FIG. 5 shows the optical element 531 as a rectangular plane plate with twelve actuators 533 arranged along its periphery. The optical useful region 537 lies in the center of the rectangular plane plate. The actuators 533 are arranged in such a way that the useful region is not restricted. The eigenmodes of rectangular plates or membranes and their calculation and modeling are likewise known to the person skilled in the art of mechanics.

FIG. 6 shows the optical element 631 having a central middle hole 639. Here actuators 633 are arranged both at the periphery of the optical element 631 and at the middle hole 639. The number and arrangement of the actuators 633 determine the number of modes that can be excited.

The actuators 633 are connected to compensation elements 641, which oscillate in antiphase with respect to the excitation of the optical element 631. This serves for decoupling the actuators 633 from the mount of the optical element 631 or from the entire mount structure of the optical apparatus. This prevents the forces applied for the excitation of oscillations of the optical element 631 from being input into the mount and causing adjacent optical elements to oscillate. The compensation elements 641 are designed such that the forces occurring are exactly compensated for. It goes without saying that compensation elements of this type may also be provided in all the other embodiments of the disclosure that are specified here.

In FIGS. 7 and 8, a liquid medium may be provided as optical element 731, 831. The oscillating optical element 731 is operated in reflection here. In this case, the liquid may itself be reflective, such as mercury for example. If appropriate, however, the liquid may also be covered with a reflective thin elastic layer, for example with a gold film. Deformations of the liquid surface are then transferred to the film. The liquid is held by a liquidtight container 743. Oscillations are excited by acoustic excitations by loudspeakers 733 fitted on the periphery of the liquid container 743.

Operation in transmission is also possible in the case of an optical element 831 made of a liquid medium. A liquid optical element operated in transmission is also referred to as a liquid lens. FIG. 8 illustrates such a liquid lens. The liquid is situated in a liquid container 843, the base of which includes a transparent plane plate 845, for example made of quartz glass, and on the periphery of which are fitted loudspeakers for the acoustic excitation of the liquid. By way of example, distilled water, sulfuric acid, perfluorinated ethers or cyclohexane are appropriate as the liquid. The form of the liquid container 843 may be configured such that the base of the container is configured as a further optical element, for example as a planoconcave or planoconvex lens.

If a liquid is used as optical element, a closed embodiment, as is illustrated in FIG. 9, can be particularly advantageous. In this way, the optical apparatus can be kept free of contamination by evaporating liquid molecules. Secondly, it is also impossible for any contamination particles from the surroundings to pass into the liquid. The liquid lens 931 in FIG. 9 is surrounded by a liquid container 943, the base of which includes a transparent plane plate 945, for example made of quartz glass. The liquid container is sealed off toward the top by a planoconvex lens 951. A liquid inlet and outlet 947 is provided in order to replenish the liquid. The thickness of the liquid lens can be set by changing the quantity of liquid. A venting opening 949 provides for pressure equalization. Loudspeakers 933 for the excitation of oscillations of the liquid lens are provided on the periphery of the liquid container 947.

In some embodiments, grating-like periodic structures can also be produced in the case of correspondingly high oscillation modes. In this way, it is possible to produce for example phase gratings as linear sinusoidal gratings, cross gratings or else radial gratings. FIG. 10 shows a rectangular optical element 1031 having a reflective surface, a multiplicity of actuators 1033 being fitted on the periphery of the optical element, wherein a grating-like structure was produced in the optical element 1031 by oscillation excitation.

Certain embodiments of the oscillating optical element are illustrated in various refinements in FIGS. 11 to 14. The optical element is configured here as an array of individual optical components, for example in the form of a lens array (FIGS. 11 and 12) or mirror array (FIG. 13) or else as an array of lenses and mirrors (FIG. 14).

FIG. 11 shows a lens array 1131 that can be caused to oscillate, in which lens array the individual lenses 1161 are connected to one another by flexible connecting elements 1163. In a simple form, the individual lenses 1163 are arranged as a planar lens array 1131. In some embodiments the array need not be planar, but rather may be arranged in a nonplanar matrix preformed in the z direction. The amplitude of a possible oscillation of the lens array 1131 is represented by arrows.

FIG. 12 shows a lens array 1231 having individual lenses 1261 on a common carrier 1265. The carrier may include a material which locally has a varying density; by way of example, the density may decrease continuously from the center of the carrier toward the edge. In this way, the oscillation amplitude is influenced locally, so that the effective optically active form of the optical element oscillating in a manner synchronized with the pulse frequency of the light source, instead of fundamentally assuming a sinusoidal form in cross section, can be configured freely by virtue of the locally varying density.

FIG. 13 shows a mirror array 1331 having flexible connecting elements 1363 and 1367 between the individual mirrors 1369. The connecting elements 1363 and 1367 each have a different stiffness. The effective optically active form of the optical element oscillating in a manner synchronized with the pulse frequency of the light source can likewise be influenced locally by the choice of connecting elements having different stiffnesses.

FIG. 14 shows an array 1431 including individual lenses 1461 and individual mirrors 1469 which are connected to one another by connecting elements 1463.

In the case of the arrays described here, the local phase and amplitude of the individual elements can be controlled by focus sensors. This is illustrated in FIG. 15. The operating radiation 1575 is reflected at the individual mirrors 1569, while the individual lenses 1561 focus the operating radiation 1575 at the point 1571. The focus sensors 1573 can be used for a control loop for the actuators 33 which excite the optical element 31 to oscillate. Such a control loop may be used not only for arrays of individual components but also for an individual oscillating optical element in accordance with FIGS. 1 to 10.

The schematic construction of such a control loop for regulating an excitation of oscillations of an individual optical element 1631 is illustrated in FIG. 16. A measuring system 1655 serves for characterizing the generated deformation of the optical element. The measuring system 1655 may for example include an interferometer with clocked illumination for measuring the surface or else have an arrangement of microphones which register the pressure fluctuations of the optical surfaces in a spatially resolved manner. It is likewise possible for the measuring system 1655 to have an arrangement of acceleration sensors which register the acceleration fluctuations of the optical surfaces in a spatially resolved manner. The measured values can be forwarded via data lines 1653 to an evaluation and control system 1651, which acquires and processes, such as also stores, the measured values. The measured values may be compared with ideal values, for example with an ideal amplitude, obtained for the oscillation of an ideal optical element from model calculations. The deviations from the ideal state are determined and the movement of the actuators 1633 for the excitation of oscillations is adapted, if appropriate, such that the oscillation characteristic of the optical element 1631 comes close to the ideal state. The adaptation of the movement of the actuators is likewise effected by the evaluation and control system 1651 via a data line 1653 connected to the actuator system 1633.

The evaluation and control system 1651 additionally serves for synchronizing the oscillation frequency of the optical element 1631 with the pulse frequency of the light source (not illustrated in FIG. 16). For this purpose, the evaluation and control system 1651 is connected to the light source.

In order to prevent forces from being transmitted to the surroundings, such as to the objective structure, by the oscillation of the optical element 31 in an undesirable manner via the lens mount and actuator system, a mechanical decoupling of the oscillating optical element from the surroundings is provided. FIG. 17 illustrates an objective having such decoupling. In this case, the oscillating optical elements 1731 are arranged in a first carrier structure 1783, while the static optical elements 1727 are arranged in a second carrier structure 1781. The two carrier structures 1781 and 1783 are mechanically separated from one another. The inner carrier structure 1781 has cut-out ring segments, similar to a crown. The outer carrier structure 1783 reaches with transverse arms 1787 through the cutouts in the inner carrier structure 1781. It is also possible to provide more than two separate carrier structures. By way of example, a dedicated carrier structure may be provided for each oscillating optical element.

FIG. 18 shows a basic circuit diagram of an optical apparatus 1810, where the optical apparatus 1810 may be for example the projection exposure machine 1 in FIG. 1.

The optical apparatus 1810 has a light source 1812, for example a laser. The optical apparatus 1810 furthermore has an optical element 1814, which may be for example the optical element 31 in the projection objective 11 of the projection exposure machine 1 in FIG. 1. It goes without saying, however, that the optical element 1814 may also be an optical element of the illumination system 5 in FIG. 1.

The light emitted by the light source 1812 is represented by an arrow 1816 in FIG. 18 and is directed through the optical element 1814.

The optical element 1814 can be excited to oscillate as described in the previous exemplary embodiments, and for this purpose the optical element 1814 is assigned apparatuses 1818 for the excitation of an oscillation, for example in the form of a piezoactuator.

The light source 1812 is assigned a clock generator 1820 (clock), which feeds a clock signal having the pulse frequency $f_{pulse}$ to the light source 1812, so that the light source 1812 emits pulsed light having the pulse frequency $f_{pulse}$.

A plurality (n) of frequency multipliers (phase locked loop (pll)) $1822_i$ (i=1, ..., n) are furthermore connected to the clock generator 1820. Each of the frequency multipliers $1822_i$ generates an integer multiple of the pulse frequency $f_{pulse}$. By way of example, the frequency multiplier $1822_3$ generates a signal having a frequency that is three times the pulse frequency $f_{pulse}$.

Each frequency multiplier $1822_i$ is assigned a phase shifter element $1824_i$ which shifts the respective phase of the frequency-multiplied signal by a value that can be set, or leaves the phase unchanged (phase shift zero).

Arranged downstream of the phase shifter elements $1824_i$ is a respective amplitude amplifier element $1826_i$, which sets the signal amplitude in a suitable manner, to be precise with a factor of less than or greater than or equal to 1.

All the signals thus processed are fed to a summation element 1828 and summed by the latter. The output of the summation element 1828 is then connected to a signal amplifier 1838, the output of which is connected to the apparatuses 1818 for the excitation of an oscillation of the optical element 1814. The apparatuses 1818 for the excitation of an oscillation to which the amplified summation signal is applied finally excite the optical element 1814 according to the summation signal.

Since the light pulses from the light source 1812 are phase-synchronous with the modulation frequencies of the optical element 1814, these always sample the same state of the periodically excited optical element 1814. The periodically modulated imaging properties thus appear to be temporally quasi stationary for the light pulses, in a manner similar to a stroboscope.

Depending on the desired properties, longitudinal and/or transverse oscillation modes of a plane plate, a lens or a mirror can be utilized to obtain a space-dependent optical effect that appears stationary given suitable synchronization with the light pulses.

FIG. 19 illustrates an optical element 1910 formed as a transparent plane plate. The optical element 1910 can also be formed as a lens, mirror or the like.

Apparatuses 1912, 1914 for the excitation of oscillations of the optical element 1910 are arranged at the edge of the optical element 1910. The apparatuses 1912, 1914 are piezoelements, for example. Predominantly lateral, i.e. longitudinal eigenmodes of the optical element 1910 can be resonantly excited by the apparatuses 1912, 1914. By the spacedependent modulation of the expansion (represented by dark and bright portions of the optical element 1910), the refractive index or the birefringence is also modulated in a space-dependent manner with an oscillation amplitude that can be set by the excitation. The excitation direction is illustrated by arrows 1916, 1918. The modulation of the refractive index then serves to obtain the desired optical effect.

Oscillation decoupling mechanisms 1920, 1922 are furthermore arranged at the optical element 1910 in order to oscillation-decouple the optical element 1910 from other optical elements of the optical system in which the optical element 1910 is present.

FIG. 20 shows an optical element 2010 comparable to the optical element 1910, in the case of which optical element 2010 apparatuses 2012, 2014 for the excitation of oscillations act transversely on the optical element 2010 in order to excite transverse oscillation modes of the optical element 2010.

While the longitudinal oscillation modes of the optical element 1910 in FIG. 19 do not or essentially do not lead to a change in the form of the surfaces of the optical element 1910, the transverse oscillations of the optical element 10 lead to a form variation that leads to an optical effect. In the case of the optical element 1910, in contrast, the modulated optical effect is predominantly based on a modulated distribution of the refractive index in the optical element 1910.

FIG. 21 shows an optical element 2110 having a gas-filled or liquid-filled space 2116 between two plates 2112 and 2114.

Longitudinal oscillation modes are excited in the gas by suitable apparatuses for the excitation of an oscillation, the modes being manifested in a modulated density distribution and thus a refractive index modulated in a space-dependent manner.

FIG. 21 illustrates regions of higher density 2118, 2120, 2122 and regions of lower density 2124, 2126, 2128 and 2130.

The regions of higher density and lower density 2118-2122 and 2124-2130, respectively, are simultaneously regions of higher pressure and lower pressure, respectively. Given a pressure difference of e.g. 28 Pa between the regions of higher pressure and the regions of lower pressure, a refractive index difference $\Delta n$ of approximately $8.3 \times 10^{-6}$ arises.

The gas-filled space 2116 of the optical element 2110 can be adapted with regard to the modulation frequencies, it also being possible for the regions of higher density and lower density 2118-2122 and 2124-2130, respectively, to be locally displaced by a suitable choice of the oscillation excitation.

Longitudinal oscillation modes can be excited in different directions, for example in the light passage direction as shown in FIG. 21, transversely with respect to the direction or simultaneously in both the aforementioned directions.

FIG. 22 shows a further optical element 2210 having a liquid layer, for example a water layer 2216, between two solid layers 2212 and 2214. The solid layers 2212, 2214 are configured as transparent plane plates, by way of example.

By laterally arranged apparatuses 2218, 2220, the liquid layer 2216 can be excited to oscillate in order to obtain an optical effect either by the density-dependent refractive index of the liquid and/or by the thickness variation of the liquid layer 2216 on account of pressure variations in the liquid and the compliance of the solid layers 2212, 2214.

FIG. 23 shows the optical element 2210 in FIG. 22; in contrast to FIG. 22, apparatuses 2318, 2320 for the excitation of an oscillation of the optical element 2210 act transversely on the optical element 2310. In this case, only the solid layer 2212 is excited, while the solid layer 2214 is sufficiently rigid on account of its greater thickness, so that the transverse oscillation modes of the solid layer 2312 are not transmitted to the solid layer 2214 via the liquid layer 2216.

FIG. 24 shows an optical element 2130, embodied as a mirror 2132. Apparatuses 2133 for generating an oscillation of the optical element 2130 are arranged at the mirror 2132, the apparatuses engaging longitudinally on a mirror substrate 2135. The mirror substrate 2135 is thereby caused to oscillate, such that a reflective mirror surface 2137 oscillates temporally, whereby a desired optical correction effect of the wavefront of a light pulse impinging on the mirror 2132 is achieved. A temporal variation of the reflective mirror surface 2137 should be understood to mean for example a local density variation of the mirror surface 2137 or a spatial deflection of local points of the mirror surface 2137.

FIG. 25 shows an optical element 2140, embodied as a partial space 2142 of an optical apparatus 2143 (cf. dashed lines in FIG. 25). The partial space 2142 is connected to a gas reservoir 2145 and filled with a gas, for example dried air (n=1.000292), carbon dioxide (n=1.00045) or xenon (n=1.00706). Furthermore, apparatuses 2147 for generating an acoustic oscillation of the gas in the partial space 2142 are present, which are configured as sound generators or microphones in the exemplary embodiment shown. By the apparatuses 2147, a temporally modulated sound wave is generated in the gas in the partial space 2142, whereby a local density change is induced in the closed partial space 2142. The sound wave is reflected at the sides of the partial space 2142. The oscillation frequency is synchronized with the pulse frequency of the light pulses, such that the light pulse passes through the partial space 2142 at a defined instant at which the gas has a specific density pattern. This enables the wavefront profile of the light pulse to be influenced in a targeted manner. Furthermore, damping elements can be arranged at the partial space 2142, which damping elements damp the generated sound wave in a suitable manner such that the wavefront of two successive light pulses can be altered differently in each case.

The configuration of the optical element 2140 as a gas-filled partial space 2142 of the optical apparatus 2143 advantageously enables a particularly simple and cost-effective improvement of the imaging behavior of the optical apparatus 2143, which improvement can be implemented in the operation of the optical apparatus 2143.

The optical element 2140 can also be embodied as the entire interior of the optical apparatus 2143 or as a disk-shaped volume for example in the region of the light passage in the optical apparatus 2143.

FIG. 26A shows an optical apparatus 2150 accommodating two optical elements 2152, 2154 that can be caused to oscillate. The two optical elements 2152, 2154 can be for example two circular plane-parallel plates spaced apart from one another or else a pellicle and a mask or a lens. The two optical elements 2152, 2154 are connected to one another via elastic sidewalls 2156, wherein an interspace 2158 is filled with a gas, for example argon. The first optical element 2152, which is arranged upstream in the light propagation direction of the light pulses, is excited to transversely oscillate by apparatuses 2160. The oscillation leads to a space-dependent deflection of the pellicle or optical element, the deflection being schematically illustrated in exaggerated fashion by the dashed lines in FIG. 26A. In addition, a specific topology is impressed on the gas, which additionally leads to a density variation and thus to a refractive index variation in the gas. This leads to a targeted influencing of the wavefront of the light pulses.

It is likewise possible that the two optical elements 2152, 2154 can be excited to trans-versely oscillate. For this purpose, an apparatus 2162 for generating an oscillation is likewise arranged at the optical element 2154. The oscillation frequencies of the two optical elements 2152, 2154 can be phase-offset for example by 180° with respect to one another. On account of the oscillations induced in the two optical elements 2152, 2154, the gas in the interspace 2158 experiences a density and refractive index variation which alters the wavefront of a temporally suitably clocked light pulse and minimizes the incorrect profile thereof in a targeted manner.

It is likewise possible for the gas in the interspace 2158 to be excited to acoustically oscillate directly by a sound generator 2164. As described above, a desired optical correction effect can thus be achieved.

FIG. 26B shows the two optical elements 2152, 2154 from FIG. 26A, which are embodied here as a plane-parallel plate and as a lens. The first optical element 2152 has a high resistance, that is to say that it is electrically insulating, and the second optical element 2154, which is arranged downstream of the optical element 2152 in the light passage direction, is electrically conductive. Induction or targeted application of electrical charges onto the first optical element 2152 by a charged rod leads to attraction or repulsion of local regions of the optical element 2152 from the second optical element 2154. The gas in the interspace 2158 experiences a corresponding density modulation. In addition, the gas in the interspace 2158 is caused to oscillate by the apparatus 2164 arranged at the interspace 2158. The density variation in the gas results in a local change in the refractive index of the gas, whereby a wavefront profile of a suitably clocked light pulse that passes through the gas can be influenced in a targeted manner.

Instead of argon, the interspace 2158 can also be filled with a liquid, for example water. FIG. 27A shows a plan view of an optical element 2170, which is embodied as a circular quartz plate 2172 having a radius R and is accommodated for example in the projection objective of the projection exposure machine. The optical element 2170 can likewise be accommodated in the illumination optical system of the projection exposure machine.

The optical element 2170 can be caused to oscillate by a sound generator 2173, whereby a sound wave propagates in the optical element 2170. The sound wave leads to longitudinal density waves which propagate in the optical element 2170 and generate a directional stress field, which in turn locally influences the birefringence properties of the optical element. In the fundamental mode, the resulting birefringence of the optical element decreases with the radius r of the circular disk radially outward to the edge of the optical element 2170 (cf. FIG. 27B). The principal axes of the birefringence are oriented radially and tangentially.

It is likewise possible for the optical element 2170 to act as a depolarizer for the polarization state of the wavefront of the light pulses of the light source. Given suitable synchronization of the oscillation frequency of the optical element 2170 and the pulse frequency of the light pulses, the optical element 2170 acts as a rapidly switchable λ/2 plate which tilts or alters the polarization state by 90° between two laser pulses. For this purpose, the laser pulses fall alternately on a minimum and a maximum of the stress field in the material of the optical element 2170.

Depending on the use of the optical element 2170 that can be caused to oscillate, both the mode of illumination and the imaging properties of the projection exposure machine can be dynamically influenced and altered in a targeted manner in order to improve their imaging quality and to correct imaging aberrations that occur. It is possible to compensate for aberrations of the wavefront profile of the light pulses of the light source or else to optimize the imaging contrast by adapting the (local) polarization state to the structure to be imaged. A use of the optical element 2170 in the illumination arrangement enables for example a generation of rotationally symmetrical modes of illumination of the projection objective and a manipulation of the coherence properties and the polarization of the light pulses of the light source.

Even though the disclosure has been described on the basis of specific embodiments, numerous variations and alternative embodiments are evident to the person skilled in the art, e.g. by combination and/or exchange of features of individual embodiments. Accordingly, for the person skilled in the art it goes without saying that such variations and alternative embodiments are concomitantly encompassed by the present disclosure.

The invention claimed is:

1. An optical apparatus, comprising:
a light source capable of emitting light in the form of light pulses having a pulse frequency;
a clock generator configured to generate the pulse frequency of the light pulses;
an optical element;
apparatuses configured to excite an oscillation of the optical element with an oscillation frequency that can be synchronized with the pulse frequency; and
a frequency multiplier, the frequency multiplier being connected to both the clock generator and the apparatuses configured to excite an oscillation,
wherein oscillation of the optical element leads to a temporally periodic modulation of at least one parameter of the optical element that is relevant to optical imaging.

2. The optical apparatus of claim 1, wherein the oscillation frequency can be set as an integer multiple of the pulse frequency.

3. The optical apparatus of claim 1, wherein the oscillation is a superposition of oscillations with different integer multiples of the pulse frequency.

4. The optical apparatus of claim 1, wherein the oscillation frequency can be set in a manner phase-shifted with respect to the pulse frequency.

5. The optical apparatus of claim 3, wherein the different integer multiples of the pulse frequency are assigned a respective phase shift.

6. The optical apparatus of claim 5, wherein the phase shift can be set.

7. The optical apparatus of claim 3, wherein each the different integer multiples of the pulse frequency is assigned a respective oscillation amplitude.

8. The optical apparatus of claim 7, wherein the oscillation amplitude can be set.

9. The optical apparatus of claim 1, further comprising a phase shifter element connected to the clock generator, wherein an output of the phase shifter element is connected to the apparatuses configured to excite an oscillation.

10. The optical apparatus of claim 1, further comprising a plurality of frequency multipliers and/or phase shifter elements connected to the clock generator, wherein outputs of the frequency multipliers and/or phase shifter elements are connected to a summation element, and an output of the summation element is connected to the apparatuses configured to excite an oscillation.

11. The optical apparatus of claim 1, wherein the apparatuses configured to excite an oscillation and the optical element are designed to excite a transverse oscillation of the optical element.

12. The optical apparatus of claim 1, wherein the apparatuses configured to excite an oscillation and the optical element are designed to excite a longitudinal oscillation of the optical element.

13. The optical apparatus of claim 1, wherein the optical element comprises a crystal-line solid, an amorphous solid, a liquid or a gas.

14. The optical apparatus of claim 1, wherein the optical element comprises birefringent material.

15. The optical apparatus of claim 1, wherein the optical element comprises a liquid or gas layer between two solid layers, and the liquid or gas layer can be excited to an oscillation.

16. The optical apparatus of claim 1, wherein the optical element comprises a liquid or gas layer between two solid layers, and at least one of the two solid layers can be excited to oscillate.

17. The optical apparatus of claim 1, wherein the optical apparatus has a pupil plane, and the optical element is arranged in the pupil plane or in the region of the pupil plane.

18. The optical apparatus of claim 1, wherein the optical apparatus has a field plane, and the optical element is arranged in the field plane or in the region of the field plane.

19. The optical apparatus of claim 1, wherein the apparatuses configured to excite an oscillation comprise loudspeakers, plunger-type coils, piezeoactuators, electrostatic, magnetostatic, hydraulically controlled and/or pneumatically controlled actuators.

20. The optical apparatus of claim 1, wherein the apparatuses f configured to excite an oscillation are arranged in the shading region of the optical element.

21. The optical apparatus of claim 20, wherein the apparatuses configured to excite an oscillation are arranged at the periphery of the optical element.

22. The optical apparatus of claim 20, wherein the optical element has a central middle hole in which are arranged apparatuses configured to excite an oscillation.

23. The optical apparatus of claim 1, wherein the optical element is essentially oscillation-decoupled relative to the surroundings.

24. The optical apparatus of claim 23, wherein the optical apparatus comprises at least one further optical element in addition to the optical element, wherein a first carrier structure is provided for the optical element, a second carrier structure is provided for the at least one further optical element, and the first and the second carrier structures are decoupled from one another in such a way that no force transmission is possible from the first carrier structure to the second carrier structure.

25. The optical apparatus of claim 23, wherein the oscillation decoupling is effected by compensation elements that can be excited to oscillate.

26. The optical apparatus of claim 1, wherein the light source is a stroboscope, a laser light source, a synchrotron, a chopped light source, an electronically switchable light source (lamp, diode), a CW light source with shutter, or a plasma source.

27. The optical apparatus of claim 1, wherein the optical element is a plane plate.

28. The optical apparatus of claim 1, wherein the optical element is a mirror.

29. The optical apparatus of claim 1, wherein the optical element comprises a liquid having a reflective surface.

30. The optical apparatus of claim 1, wherein the optical element is a lens.

31. The optical apparatus of claim 30, wherein the optical element is a liquid lens.

32. The optical apparatus of claim 1, wherein the optical element comprises an array of individual optical components.

33. The optical apparatus of claim 32, wherein the individual optical components comprise lenses, mirrors, gratings and/or flat lens segments that are refractive in sections and/or in zones.

34. The optical apparatus of claim 32, wherein the individual optical components have identical geometries.

35. The optical apparatus of claim 32, wherein the individual optical components have different geometries.

36. The optical apparatus of claim 32, wherein the individual optical components are connected to one another by connecting elements, wherein at least two connecting elements have different elasticity properties.

37. The optical apparatus of claim 1, wherein the optical element is at least one gas-filled partial space of the optical apparatus.

38. The optical apparatus of claim 1, wherein the optical apparatus has at least two optical elements which are spaced apart from one another and between which is arranged an interspace with gas or liquid.

39. The optical apparatus of claim 38, wherein one of the two optical elements, the two optical elements and/or the interspace with gas or liquid can be excited to oscillate.

40. The optical apparatus of claim 38, wherein a first optical element of the two optical elements is electrically insulating, and a second optical element of the two optical elements is electrically conductive.

41. The optical apparatus of claim 1, wherein the elasticity properties of the optical element vary locally.

42. The optical apparatus of claim 1, wherein the optical element has a thickness that varies locally from its center toward its edge.

43. The optical apparatus of claim 1, further comprising a control unit comprising a measuring system, an evaluation system and a control system.

44. The optical apparatus of claim 43, wherein the measuring system comprises one or more focus sensors, an interferometer with clocked illumination, a polarization measuring unit or an arrangement of microphones or acceleration sensors to measure control parameters of the optical element.

45. The optical apparatus of claim 43, wherein the measuring system comprises a wavefront sensor to measure control parameters of the optical apparatus.

46. The optical apparatus of claim 43, wherein the measuring system comprises a polarimetric sensor with measuring channels operating in parallel for the synchronous measurement of the polarization state of the light wave field at a plurality of field points in order to determine the control parameters for the entire optical apparatus.

47. The optical apparatus of claim 43, wherein the control system comprises a synchronization system to synchronize the oscillation frequency of the oscillation of the optical element with the pulse frequency of the light source.

48. The optical apparatus of claim 1, wherein the optical apparatus comprises at least one further manipulatable optical element configured in displaceable fashion, in tiltable fashion or in statically deformable fashion.

49. A machine, comprising:
an optical apparatus according to claim 1,
wherein the machine is a projection exposure machine.

50. The machine of claim 49, wherein the comprises an illumination system, and the optical element is arranged within the illumination system.

51. The machine of claim 49, further comprising a projection objective, and the optical element is arranged within the projection objective.

52. A method, comprising:
providing a projection exposure machine, comprising:
 a pulsed light source having a pulse frequency;
 an optical element;
 oscillating the optical element with an oscillation frequency that is synchronized with the pulse frequency of the pulsed light source so that there is a temporally periodic modulation of at least one parameter of the optical element that is relevant to optical imaging of the projection exposure machine,
wherein the oscillation frequency of the optical element is set as an integer multiple of the pulse frequency, and the method modifies imaging behaviour of the projection exposure machine.

* * * * *

UNITED STATES PATENT AND TRADEMARK OFFICE
CERTIFICATE OF CORRECTION

PATENT NO. : 8,169,595 B2
APPLICATION NO. : 12/357126
DATED : May 1, 2012
INVENTOR(S) : Martin Schriever Page 1 of 1

It is certified that error appears in the above-identified patent and that said Letters Patent is hereby corrected as shown below:

Column 2,
Line 10, Delete "modula-tion" and insert --modulation--

Column 19,
Line 50, Delete "trans-versely" and insert --transversely--

Column 21,
Line 31, Delete "each the" and insert --each of the--

Column 22,
Line 12-13, after "apparatuses" delete "f"

Column 24,
Line 12, Delete "the comprises" and insert --the machine comprises--

Signed and Sealed this
Tenth Day of July, 2012

David J. Kappos
*Director of the United States Patent and Trademark Office*